United States Patent [19]

Suzuki

[11] Patent Number: 5,233,244
[45] Date of Patent: Aug. 3, 1993

[54] JOSEPHSON LOGIC GATE HAVING A PLURALITY OF INPUT PORTS AND A JOSEPHSON LOGIC CIRCUIT THAT USES SUCH A JOSEPHSON LOGIC GATE

[75] Inventor: Hideo Suzuki, Kawasaki, Japan

[73] Assignee: Fujitsu Limited, Kawasaki, Japan

[21] Appl. No.: 856,730

[22] Filed: Mar. 24, 1992

[30] Foreign Application Priority Data

Mar. 25, 1991 [JP] Japan .................................. 3-60450
Sep. 10, 1991 [JP] Japan ................................ 3-230352
Sep. 18, 1991 [JP] Japan ................................ 3-237849

[51] Int. Cl.$^5$ ............................................. H03K 17/92
[52] U.S. Cl. ................................. 307/476; 307/462; 307/463; 307/465; 307/306
[58] Field of Search ............... 307/443, 462, 463, 465, 307/476, 277, 306

[56] References Cited

U.S. PATENT DOCUMENTS

| | | | |
|---|---|---|---|
| 3,848,259 | 11/1974 | Herrell | 307/476 X |
| 4,012,642 | 3/1977 | Guéret | 307/277 X |
| 4,039,856 | 8/1977 | Schlig | 307/277 X |
| 4,097,265 | 6/1978 | Zappe | 307/462 X |
| 4,275,314 | 6/1981 | Fulton | 307/462 |
| 4,413,196 | 11/1983 | Josephs et al. | 307/306 X |
| 4,413,197 | 11/1983 | Josephs et al. | 307/462 |
| 4,713,562 | 12/1987 | Hasuo et al. | 307/476 X |
| 5,164,618 | 11/1992 | Murphy et al. | 307/462 X |

OTHER PUBLICATIONS

Gheewala, "A 30-ps Josephson Current Injection Logic (CIL)", IEEE J.S.S.C., vol. SC-14, No. 5, Oct. 1979, pp. 787-793.
Harada et al., "The Promise of Josephson Devices for Very Fast Switching Speeds," Japan Journal of Electronic Engineering, vol. 21, No. 208, Apr. 1984, Tokyo, JP, pp. 32-38.
Patent Abstracts of Japan, vol. 9, No. 3 (E-298)(1766) Feb. 22, 1984 & JP-A-59 183530 (Nippon Denshin Denwa Kosha) Oct. 10, 1984.
Patent Abstracts of Japan, vol. 13, No. 561 (E-859)(3909) Dec. 13, 1989 & JP-A-1 233915 (Fujitsu Ltd) Sep. 19, 1989.
Patent Abstracts of Japan, vol. 15, No. 125 (E-1050) Mar. 27, 1991 & JP-A-3 011824 (Hitachi Ltd) Jan. 21, 1991.

Primary Examiner—David R. Hudspeth
Attorney, Agent, or Firm—Staas & Halsey

[57] ABSTRACT

A multiple-input Josephson AND gate having a plurality of input ports comprises a plurality of Josephson logic gate elements of a number corresponding to the number of said input ports and cascaded with each other from a first stage to a final stage, each of the Josephson logic gate elements of said first through final stages including: a superconducting quantum interferometer for producing an output signal in response to a transition from a superconducting state to a finite voltage state, an input line connected to a corresponding input port and receiving therefrom an input current, the input line being coupled magnetically to the superconducting quantum interferometer and transferring the input current to said superconducting quantum interferometer; and a biasing part for supplying a bias current to the superconducting quantum interferometer at a level such that the superconducting quantum interferometer undergoes the transition to the finite voltage stage in response to the input current supplied to the input line, wherein each of the respective biasing parts of the second through final stages is supplied with the output signal of the superconducting quantum interferometer of the respective, next previous stage as a trigger signal and produces the bias current in response to the trigger signal.

11 Claims, 18 Drawing Sheets

JOSEPHSON LOGIC GATE HAVING A PLURALITY OF INPUT PORTS AND A JOSEPHSON LOGIC CIRCUIT THAT USES SUCH A JOSEPHSON LOGIC GATE

BACKGROUND OF THE INVENTION

The present invention generally relates to Josephson devices and more particularly to a Josephson logic gate having a multiple-input construction. The present invention is related also to a Josephson logic circuit wherein such a Josephson logic gate is used.

The Josephson devices are characterized by extremely fast operational speed and low power consumption. Thus, the device is suitable for super-fast computers or processors, and intensive efforts have been made to construct various digital circuits based upon a Josephson integrated circuit. In the Josephson integrated circuits, the logic gates are generally constructed in the form of AND gate and OR gate elements.

Conventionally, these Josephson logic gates have been constructed to have one or two input ports for the input logic signals. Hereinafter, the problem associated with the Josephson logic gates having multiple input ports will be examined briefly.

FIG. 1 shows an example of the simplest Josephson gate having a single input port A.

Referring to FIG. 1, the Josephson gate includes two Josephson junctions J11 and J12 that are arranged, together with first and second superconducting windings La and Lb, to form a closed loop 1 that acts as a superconducting interferometer. At a node where the windings La and Lb are connected, an a.c. bias current $I_g$ is supplied from a bias terminal 20 via a resistor R, and the bias current thus supplied is caused to flow to a superconducting ground plane GND via a first current path including the winding La and the Josephson junction $J_1$ and further via a second current path including the winding Lb and the Josephson junction $J_2$. The input logic signal is supplied to an input line 21 via an input port A, wherein the input line 21 includes inductances La' and Lb' that cause a magnetic coupling respectively with the windings La and Lb of the superconducting loop 1. Thereby, the Josephson junctions J11 and J12 experience a transition to a finite voltage state according to a characteristic curve shown in FIG. 2. In the device of FIG. 1, the output is obtained at the node where the resistor R is connected to the superconducting loop 1.

Referring to FIG. 2 showing the relationship between the input current $I_c$ and the bias current $I_g$, the Josephson junctions J11 and J12 undergo the transition to the finite voltage state in the region designated in FIG. 2 by hatching. Thus, when the bias current $I_g$ is held constant, the increase in the current $I_c$ causes the switching by crossing the characteristic curve, wherein the threshold value of the current $I_c$ at which the foregoing transition occurs increases with decreasing current $I_g$. In the Josephson gate of the two-junction construction described above, however, there exists a problem in that the region of the finite voltage state is relatively limited. Associated therewith, the operational (i.e., operating) margin of the device is limited. This problem becomes particularly conspicuous when the number of the input lines is increased.

FIG. 3 shows another typical Josephson logic gate that uses a superconducting interferometer loop 2 wherein three Josephson junctions J11, J12 and J13 are included together with superconducting windings La and Lb. In this case, too, the input logic signal supplied to the line 21 via an input port A is transferred to the loop 2 as a result of the magnetic coupling of inductances La' and Lb' included in the line 21 with the corresponding superconducting windings La and Lb of the loop 2. In the gate of this example, the bias current $I_g$ is supplied from the bias terminal 20 to respective midpoints of the windings La and Lb via the resistor R, and the bias current thus supplied is caused to flow to the superconducting ground plane GND via the Josephson junctions J11, J12 and J13. Thereby, the device shows an operational characteristic as represented in FIG. 4. There, the output of the gate is obtained at the node where the resistor R is connected to the superconducting windings La and Lb.

In the characteristic curve shown in FIG. 4, too, the region of the finite voltage state of the Josephson junctions J11–J13 is indicated by the hatching. In this case, the region of the finite voltage state is expanded as compared with the characteristic curve shown in FIG. 2. Thus, the device of FIG. 3 shows an improved operational margin as compared with the device of FIG. 1.

Using the improved operational margin, the device of FIG. 3 is used successfully to construct the dual input AND gate. There, another input line is provided in magnetic coupling with the interferometer loop 2, and the bias current $I_g$ is set such that the transition occurs only when the input current is supplied to both input lines simultaneously. Further, there is an attempt to construct a Josephson AND gate that has three or more input ports based upon the device of FIG. 3 (Hatano, Y. et al. IEEE J. Solid-State Circuits, Vol.sc-22, No.4, Aug. 1987).

FIG. 5 shows such a three-input Josephson AND gate constructed based upon the superconducting interferometer 2 of FIG. 3, wherein there are provided three input lines 21–23 respectively connected to input ports A–C. There, the bias current $I_g$ is set to a magnitude such that the transition of the Josephson junctions J11–J13 occurs only when the input current is caused to flow simultaneously through the input lines 21–23 in correspondence to the logic state wherein the logic data "1" is supplied simultaneously to the input ports A–C.

In the multiple-input Josephson AND gate that is constructed based on the superconducting interferometer loop 2 of FIG. 3, however, it will be easily understood that there exists a problem of the operational margin becoming increasingly smaller with an increasing number of input lines. More specifically, the tolerance in the variation of the input current becomes increasingly stringent, as it is the sum of the input currents that cause the transition of the Josephson junctions. Thereby, the logic gate becomes increasingly vulnerable to noises and the risk of erroneous operation increases substantially.

SUMMARY OF THE INVENTION

Accordingly, it is a general object of the present invention to provide a novel and useful Josephson logic circuit wherein the foregoing problems are eliminated.

Another and more specific object of the present invention is to provide a Josephson AND gate that is capable of increasing the number of input ports without sacrificing the reliability of operation.

Another object of the present invention is to corresponding a multiple-input Josephson AND gate having a plurality of input ports, comprising: a plurality of Josephson logic gate elements corresponding in number to the number of said input ports and cascaded with each other from a first stage to a final stage, each of said Josephson logic gate elements of said first through final stages comprising: a superconducting quantum interferometer for producing an output signal in response to a transition from a superconducting state to a finite voltage state; an input line connected to a corresponding input port for carrying thereon an input current, said input line being coupled magnetically to the superconducting quantum interferometer for transferring the input current to said superconducting quantum interferometer; and biasing means for supplying a bias current to said superconducting quantum interferometer, said biasing means supplying the bias current at a level such that said superconducting quantum interferometer causes said transition to the finite voltage stage in response to the input current supplied to the input line, each of said biasing means of said second through final stages being supplied with the output signal of the superconducting quantum interferometer of the previous stage as a trigger signal and producing said bias current in response to said trigger signal. According to the present invention, one can increase the number of stages and hence the number of input ports of the Josephson AND gate while using the reliable single-input Josephson gate element for each stage. When the input logic signals are supplied simultaneously to all of the input ports, the transition of the Josephson gate elements occurs first at the initial stage and proceeds to the final stage consecutively. As a result of the transition, a logic signal indicative of the result of the AND operation is obtained at the Josephson logic gate element of the final stage.

Another object of the present invention is to provide various Josephson logic circuits that use therein a number of Josephson AND gates each having a plurality of input ports.

Another object of the present invention is to provide a Josephson decoder circuit for decoding input data represented by a plurality of bits, comprising: a plurality of multiple-input Josephson AND gates each including a plurality of Josephson logic gate elements corresponding in number to the number of bits of the input data, said plurality of Josephson logic gate elements being cascaded, in each Josephson AND gate, with each other from a first stage to a final stage; each of said Josephson logic gate elements comprising: a superconducting quantum interferometer for producing an output signal in response to a transition from a superconducting state to a finite voltage state; an input line connected to a corresponding input port for carrying thereon an input current, said input line being coupled magnetically to the superconducting quantum interferometer for transferring the input current to said superconducting quantum interferometer; and biasing means for supplying a bias current to said superconducting quantum interferometer, said biasing means supplying the bias current at a level such that said superconducting quantum interferometer causes said transition to the finite voltage stage in response to the input current supplied to the input line, each of said biasing means of said second through said final stages being supplied with the output signal of the superconducting quantum interferometer of the previous stage as a trigger signal and producing said bias current in response to said trigger signal; interconnection means for connecting the input lines of the Josephson logic gate elements of different Josephson AND gates with each other for each of the stages such that the input data is supplied to the Josephson AND gates according to a logic combination that is different in each Josephson AND gate. According to the present invention, one can construct the decoding circuit without complicating the circuit arrangement, by simply arranging the Josephson AND gates and connecting the input lines appropriately.

Another object of the present invention is to provide a programmable logic array circuit supplied with input data for producing output data after a predetermined logic operation, comprising: a programmable Josephson AND array comprising a plurality of multiple-input Josephson AND gates each including a plurality of Josephson logic gate elements corresponding in number to the number of bits of the input data, said plurality of Josephson logic gate elements being cascaded, in each Josephson AND gate, with each other from a first stage to a final stage; each of said Josephson logic gate elements comprising: a superconducting quantum interferometer for producing an output signal in response to a transition from a superconducting state to a finite voltage state; an input line connected to a corresponding input port for carrying thereon an input current, said input line being coupled magnetically to the superconducting quantum interferometer for transferring the input current to said superconducting quantum interferometer; and biasing means for supplying a bias current to said superconducting quantum interferometer, said biasing means supplying the bias current at a level such that said superconducting quantum interferometer causes said transition to the finite voltage stage in response to the input current supplied to the input line, each of said biasing means of said second through said final stages being supplied with the output signal of the superconducting quantum interferometer of the previous stage as a trigger signal and producing said bias current in response to said trigger signal; interconnection means for connecting the input lines of the Josephson logic gate elements of different Josephson AND gates with each other for each of the stages such that the input data is supplied to the Josephson AND gates according to a logic combination that is different in each Josephson AND gate, said interconnection means prohibiting supply of the input data to a selected Josephson gate element of a selected Josephson AND gate; and a programmable Josephson OR array supplied with the output data of the programmable Josephson AND array, said programmable Josephson OR array comprising a plurality of Josephson logic gate elements each comprising a superconducting quantum interferometer and an input line carrying thereon an input current, said input line being coupled magnetically to the superconducting quantum interferometer for transferring the input current to said superconducting quantum interference loop, said Josephson logic OR array producing output data according to a logic sum operation of the output data of said programmable Josephson AND array, said programmable Josephson OR array including a selected Josephson logic gate element that is disabled. According to the present invention, one can construct the programmable logic array without using timed inverters or timing signals. Thereby, the circuit construction is significantly simplified.

Other objects and further features of the present invention will become apparent from the following detailed description when read in conjunction with the attached drawings.

DETAILED DESCRIPTION OF THE PREFERRED EMBODIMENTS

Figure 6:
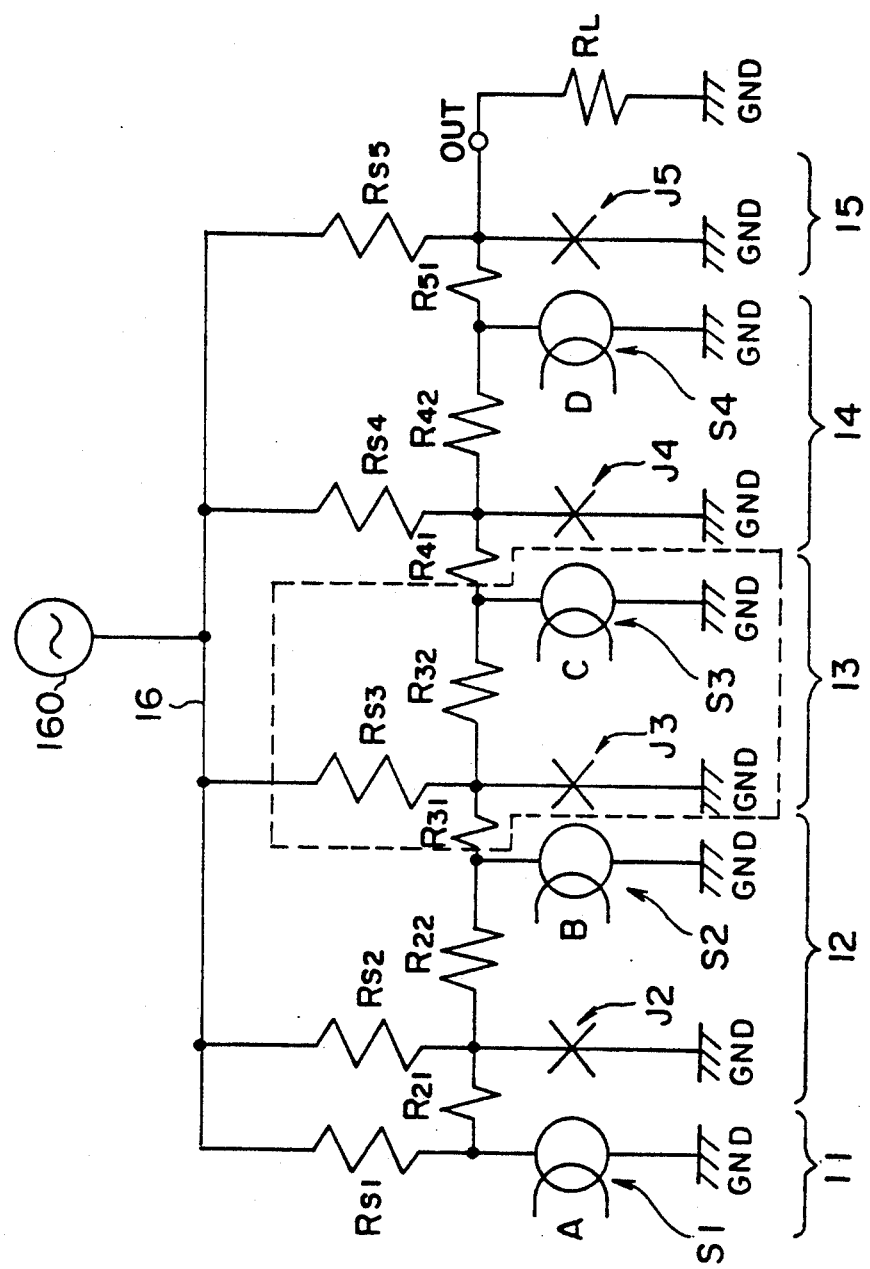
FIG. 6 is a circuit diagram showing the construction of a four-input Josephson AND gate according to a first embodiment of the present invention.

FIG. 6 shows a four-input AND gate according to a first embodiment of the present invention.

Referring to FIG. 6, the circuit includes a first input stage 11, a second input stage 12, a third input stage 13, a fourth input stage 14 and an output stage 15, wherein the first stage 11 includes a superconducting quantum interferometer $S_1$ that has a construction substantially identical with the Josephson gate explained with reference to FIG. 3. The quantum interferometer $S_1$ is supplied with an a.c. bias current from a bias bus 16 via a resistor $R_{S1}$ and operates similarly to the device of FIG. 3 with the operational characteristic shown in FIG. 4. It should be noted that an a.c. current source similar to the a.c. current source 160 is connected to the bias bus 16 for supplying the a.c. bias current thereto.

The second stage 12 in turn includes a Josephson junction $J_2$ having a first end connected to the output terminal of the device $S_1$ via a resistor $R_1$ and another end connected to the superconducting ground plane. The first end of the Josephson junction $J_2$ is connected further to the bias bus 16 via a resistor $R_{S2}$ and the bias current is caused to flow to the ground plane as long as the Josephson junction $J_2$ is in the superconducting state. Further, the second stage 12 includes a superconducting quantum interferometer $S_2$ that is connected to the first end of the Josephson junction $J_2$ via a resistor $R_2$ for receiving the bias current As long as the Josephson junction $J_2$ is in the superconducting state, no bias current is supplied to the superconducting interferometer $S_2$, and the superconducting interferometer $S_2$ is held in the superconducting state.

The third stage 13 and the fourth stage 14 have a construction substantially identical with the construction of the second stage 12. Thus, the third stage 13 includes a Josephson junction $J_3$ that is biased via a resistor $R_{S3}$ at a first end and is connected to the superconducting ground plane at the other end. Further, the first end of the Josephson junction $J_3$ is connected to the output terminal of the superconducting quantum interferometer $S_2$ of the previous stage via a resistor $R_{31}$, while the same first end of the Josephson junction $J_3$ is connected to a superconducting quantum interferometer $S_3$ via a resistor $R_{32}$.

Similarly, the fourth stage 14 includes a Josephson junctions $J_4$ that is biased via a resistor $R_{S4}$ at a first end and is connected to the superconducting ground plane at the other end. Further, the first end of the Josephson junction $J_4$ is connected to the output terminal of the superconducting quantum interferometer $S_3$ of the previous stage via a resistor $R_{41}$, while the same first end of the Josephson junction $J_4$ is connected to a superconducting quantum interferometer $S_4$ via a resistor $R_{42}$. In the foregoing construction, the stage 13 is connected in cascade to the stage 12 while the stage 14 is connected in cascade to the stage 13.

In the output stage 15, a Josephson junction $J_5$ is provided such that the Josephson junction $J_5$ has a first end that is connected to the superconducting quantum interferometer $S_4$ of the previous stage via the resistor $R_{51}$ and a second end connected to the superconducting ground plane. Further, the bias current is supplied to the Josephson junction $J_5$ via a resistor $R_{S5}$. There, a load resistance $R_L$ is connected to an output terminal OUT that in turn is connected to the node where the resistors $R_{51}$ and $R_{S5}$ are connected junction $J_5$. Here, it should be noted that the load resistance $R_L$ may represent the equivalent load resistance of the Josephson circuits that are connected after the output stage 15.

Figure 3:
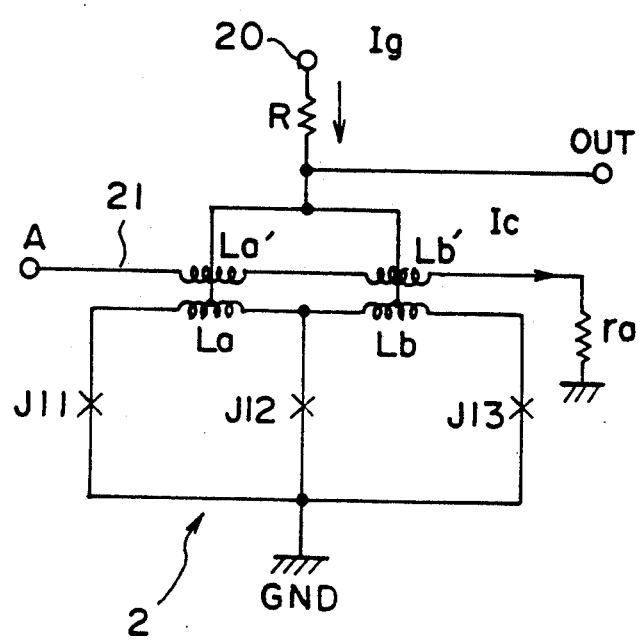
FIG. 3 is a circuit diagram showing the construction of a conventional Josephson logic gate that includes three Josephson junctions in a superconducting loop.
Figure 4:
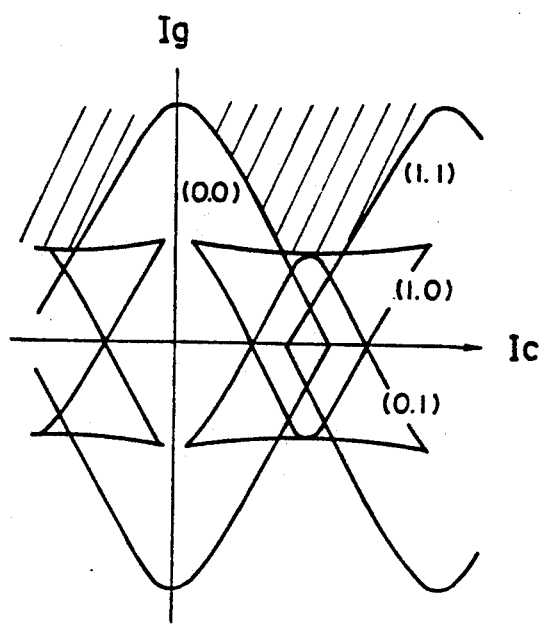
FIG. 4 is a diagram showing the operational characteristic of the device of FIG. 3.
Figure 5:
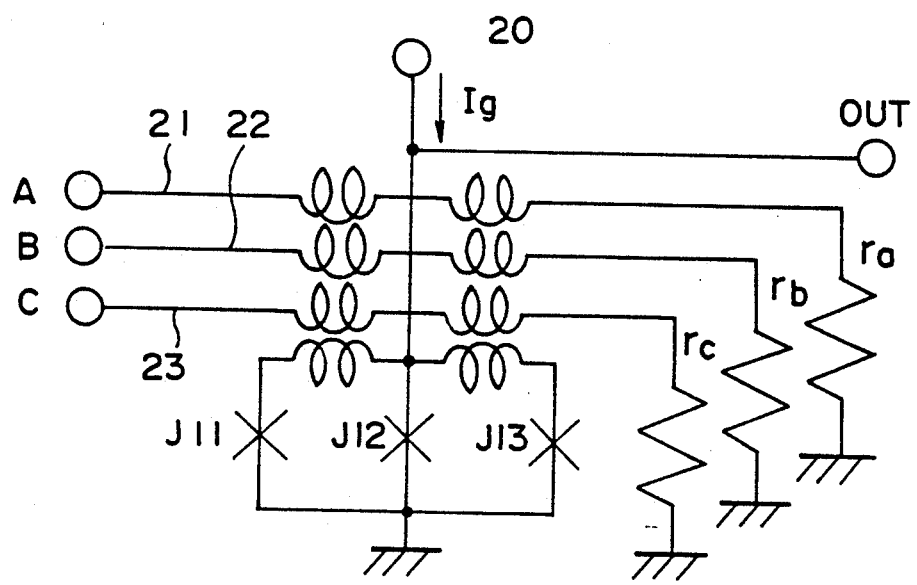
FIG. 5 is a circuit diagram showing the construction a three-input Josephson AND gate proposed previously.

In the superconducting quantum interferometer of FIG. 3 that is used for the devices $S_1$–$S_5$ of FIG. 6, the Josephson junctions $J_{11}$, $J_{12}$ and $J_{13}$ are configured such that the critical current of the Josephson junction $J_{12}$ is twice as large as the critical current of the Josephson junction $J_{11}$ or the critical current of the Josephson junction $J_{13}$. There, the Josephson junctions $J_{11}$ and the Josephson junction $J_{13}$ have the same critical current. On the other hand, the Josephson junctions $J_2$–$J_5$ are configured to have a common critical current, represented as $I_m$. In correspondence to the critical current $I_m$, the values of the resistors $R_{22}$, $R_{32}$ and $R_{42}$ are all set equal to $V_g/I_m$ wherein $V_g$ represents the gap voltage of the Josephson junctions $J_2$–$J_5$. More specifically, the critical current $I_m$ may be set equal to 0.4 mA, and the value of each of the resistors $R_{22}$–$R_{42}$ is set to 8 $\Omega$. The value of the resistors $R_{21}$–$R_{51}$ may be set to 2 $\Omega$.

Next, the operation of the four-input AND gate of FIG. 6 will be described in detail.

Starting from a state wherein all the Josephson junctions in the circuit of in FIG. 6 are in the superconducting state, the bias current is supplied from the bias bus 16 to each of the superconducting quantum interferometers $S_1$–$S_4$ as well as to each of the Josephson junctions $J_2$–$J_5$.

In this state, an input signal A supplied to the first stage causes a transition of the superconducting quantum interferometer $S_1$ and the bias current is supplied from the resistor $R_{S1}$ to the Josephson junction $J_2$ via the resistor $R_{21}$. There, the Josephson junction $J_2$ is driven with a bias current that is a sum of the bias current flowing through the resistor $R_{21}$ and the resistor $R_{S2}$. In response to this, the Josephson junction $J_2$ undergoes a switching to the finite voltage state. It should be noted that, before the transition of the superconducitng quantum interferometer $S_1$, the bias current is not supplied to the Josephson junction $J_2$ via the resistor $R_{21}$ because of the zero resistance of the superconducting quantum interferometer $S_1$.

In response to the switching of the Josephson junction $J_2$, a bias current is supplied from the resistor $R_{S2}$ to the superconducting quantum interferometer $S_2$ via the resistor $R_{22}$. It should be noted that the superconducting quantum interferometer $S_2$ is not biased at all before the Josephson junction $J_2$ switches.

When an input signal is supplied to the input port B under this state, the superconducting quantum interferometer $S_2$ causes the switching to the finite voltage state and the bias current is now supplied to the Josephson junction $J_3$ via the resistor $R_{31}$. There, the Josephson junction $J_3$ is biased by a bias current that is equal to the sum of the bias current supplied via the Josephson junction $J_3$ and the bias current supplied via the resistor $R_{S3}$. Thereby, the Josephson junction $J_3$ undergoes a switching to the finite voltage state.

This switching of the Josephson junction $J_3$ in turn causes the biasing of the superconducting quantum interferometer $S_3$ and the superconducting quantum interferometer $S_3$ is thereby switched to the finite voltage state when there is an input to the input port C. In this way, the switching of the superconducting interferometer $S_i$ and the Josephson junction $J_i$ proceeds consecutively from the initial stage to the final stage, provided that an input signal indicating the logic high level is supplied to all of the input ports A–D. Herein, the suffix i represents the number of the stage. When one of the input port lacks the input signal in correspondence to the logic low level state, the progressive switching to the finite voltage state is interrupted at the stage corresponding to the input port, and the output signal supplied to the load $R_L$ assumes the logic low level state. Thus, the circuit of FIG. 6 operates as a multiple-input AND gate.

In the foregoing operation, it is important to note that the Josephson junctions $J_2$–$J_5$ produce a voltage corresponding to the gap voltage of the Josephson junction when switched to the finite voltage state. As the gap voltage is determined by the material that is used for the Josephson junction, this means that the bias current supplied to the superconducting quantum interferometer $S_i$ from the preceding Josephson junction $J_i$ via the resistor $R_{i2}$ is determined without ambiguity by the value of the resistor $R_{i2}$. In other words, the bias current that has caused the switching of the superconducting quantum interferometer of the previous stage such as $S_{i-1}$ does not affect at all the bias current that causes the switching of the superconducting quantum interferometer $S_i$. Thus, the operation of the multiple-input AND gate of FIG. 6 is reliable even when the number of stage is increased in correspondence to the increased number of input ports.

Further, it should be noted that each superconducting quantum interferometer $S_i$ has only one input line. Thereby, one can obtain a sufficient operational margin for the switching operation of the superconducting quantum interferometer. See the operational characteristic of FIG. 3. Because of the sufficient operational margin, it is generally not necessary to supply an input signal to the port A in correspondence to the progressive operation from the first state to the final stage. Even when the input signals are supplied simultaneously to all input ports, there is a sufficient margin of time for the foregoing progressive switching operation.

Figure 7:
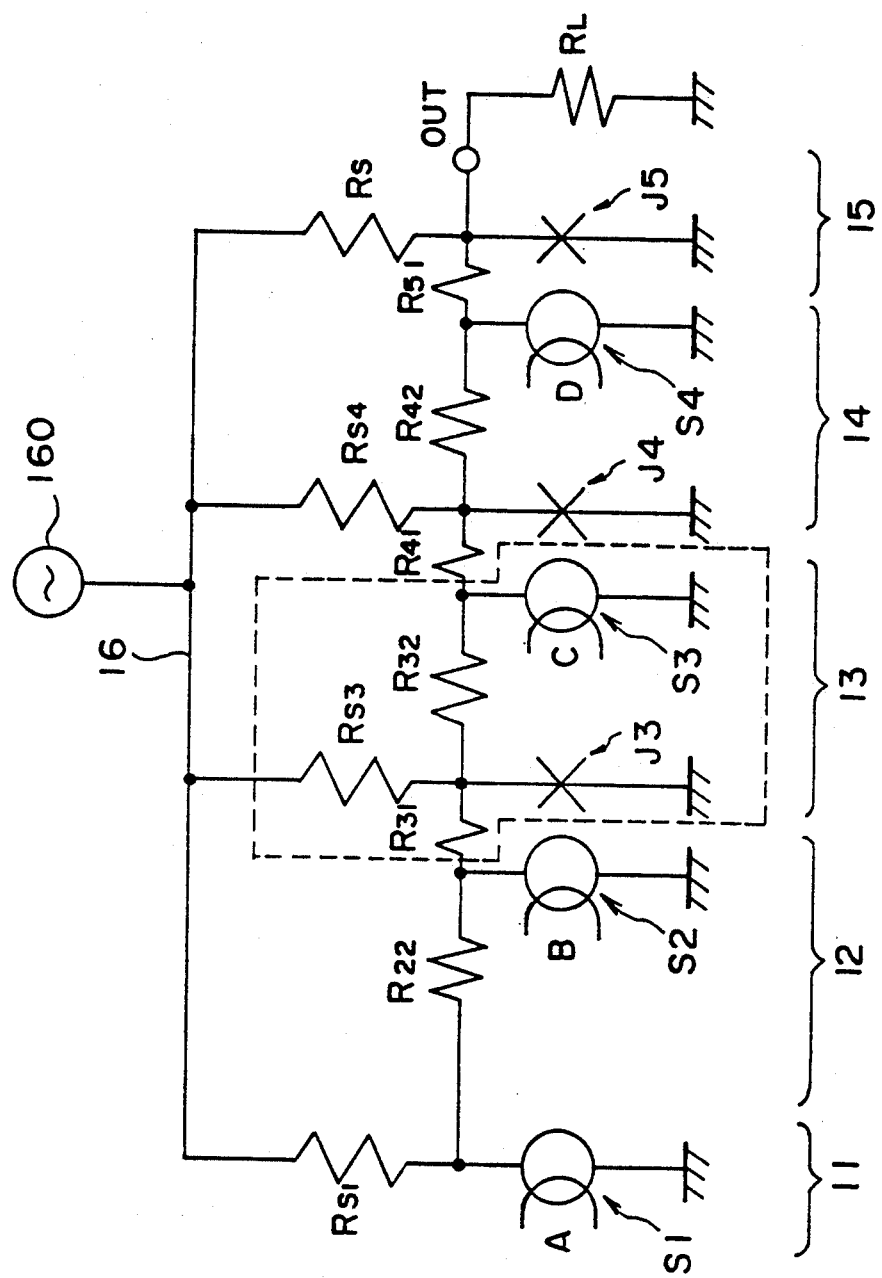
FIG. 7 is a circuit diagram showing the construction of a four-input Josephson AND gate according to a second embodiment of the present invention.

FIG. 7 shows a four-input AND gate according to a second embodiment of the present invention. In this embodiment, the Josephson junction $J_2$ and the corresponding bias resistance $R_{S2}$ are omitted. Thereby, the superconducting quantum interferometer $S_2$ of the second state is supplied with the bias current from the resistors $R_{S1}$ and $R_{22}$ when the superconducting quantum interferometer $S_1$ has caused a switching. Even in this case, the foregoing progressive switching occurs and the circuit operates as the multiple-input AND gate. Although the margin of the bias current may become somewhat stringent, the circuit of the present invention has the advantage of a reduced number of parts.

Figure 1:
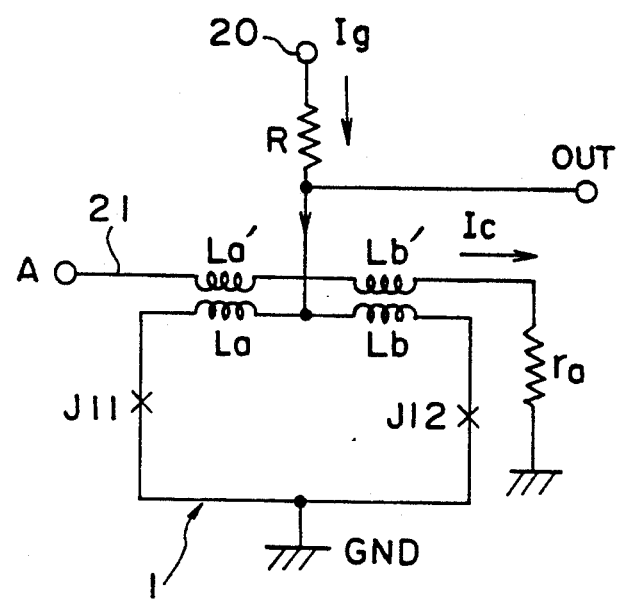
FIG. 1 is a circuit diagram showing the construction of a conventional Josephson logic gate that includes two Josephson junctions in a superconducting loop.
Figure 8:
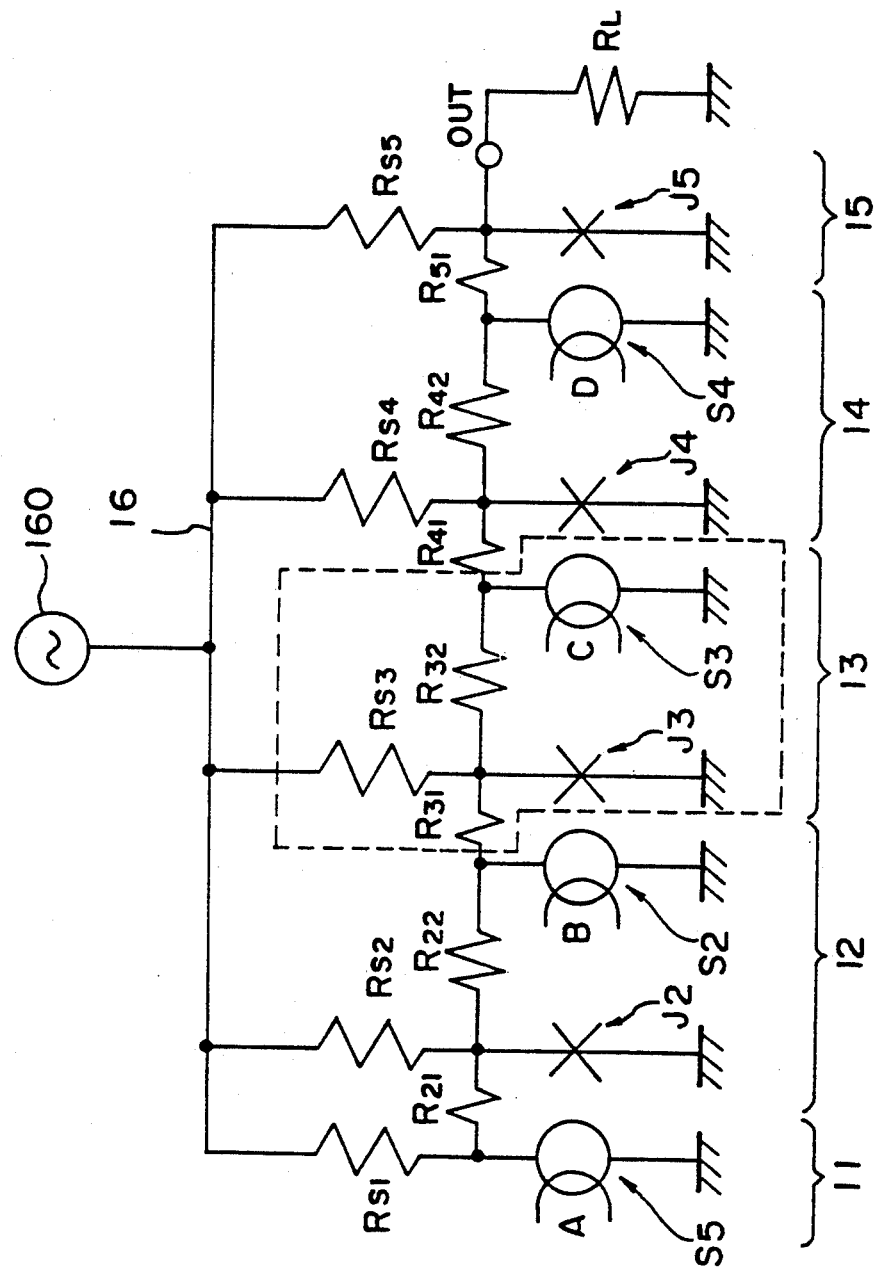
FIG. 8 is a circuit diagram showing the construction of a four-input Josephson AND gate according to a third embodiment of the present invention.

FIG. 8 shows a four-input AND gate according to a third embodiment of the present invention. The circuit of FIG. 8 is substantially identical to the circuit of FIG. 6 except that a two-junction type superconducting quantum interferometer $S_5$ as shown in FIG. 1 is used in place of the superconducting quantum interferometer $S_1$. The superconducting quantum interferometer $S_5$ may be the symmetric type wherein the respective critical junctions $J_{11}$ and $J_{12}$ have the same critical current or the asymmetric type wherein the respective critical currents in the Josephson junction $J_{11}$ and $J_{21}$ are different.

Figure 2:
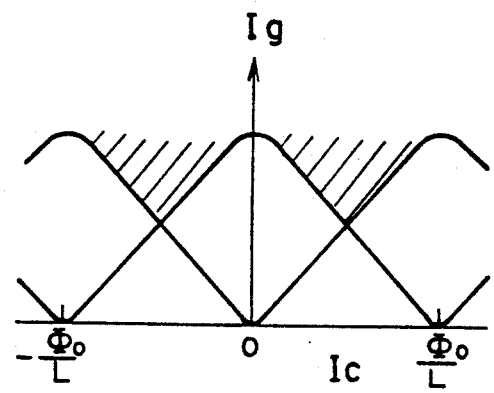
FIG. 2 is a diagram showing the operational characteristic of the device of FIG. 1.

As the two-junction type superconducting quantum interferometer has a limited operational margin as already explained with reference to FIG. 2, it is desirable to set the timing of the input signals, in the circuit of the present invention, such that the input signals are supplied first to the input ports B-D and subsequently to the input port A. On the other hand, the circuit of FIG. 8 has an advantageous feature in that the circuit construction can be simplified as a result of use of the two-junction type superconducting quantum interferometer.

Figure 9:
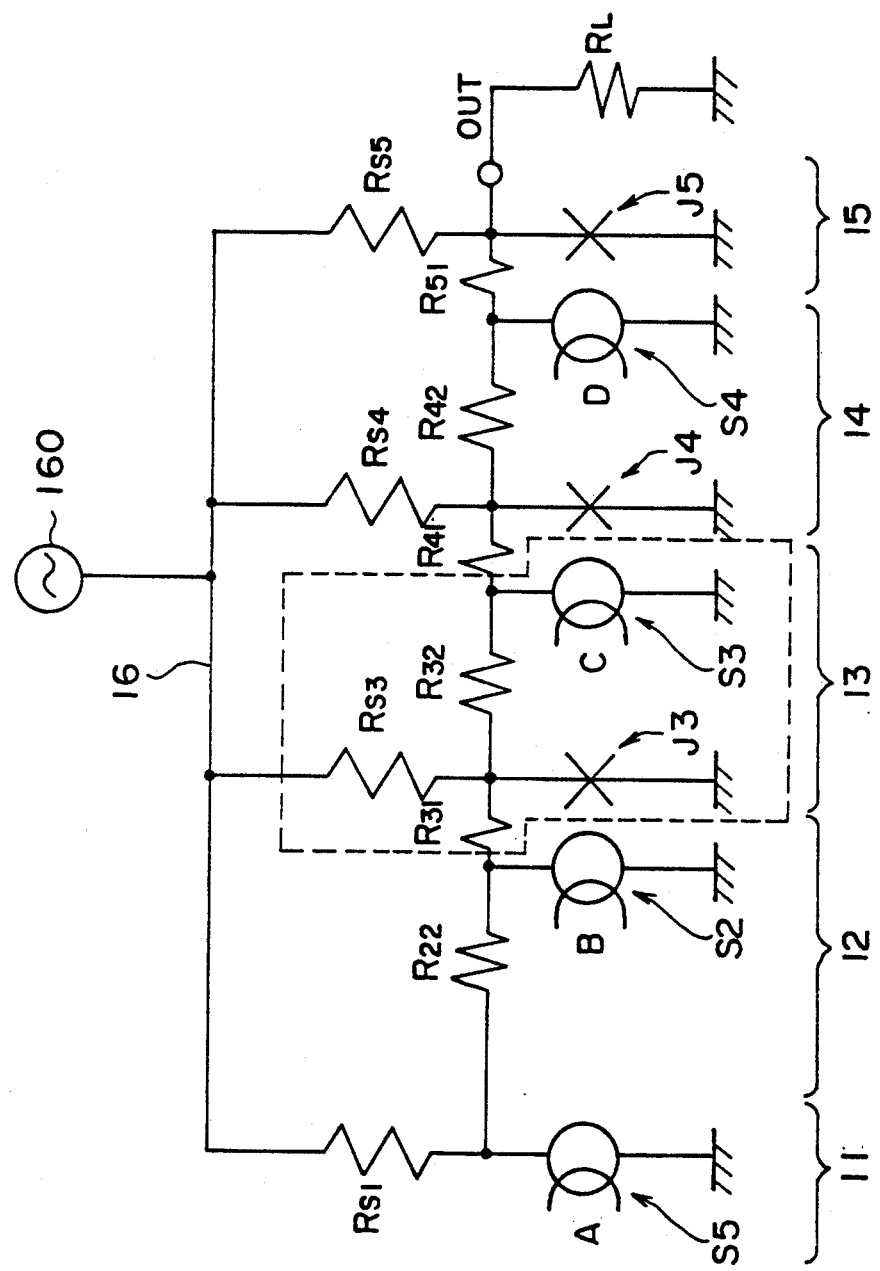
FIG. 9 is a circuit diagram showing the construction of a four-input Josephson AND gate according to a fourth embodiment of the present invention.

FIG. 9 shows a four-input AND gate according to a fourth embodiment of the present invention. In this embodiment, the superconducting quantum interferometer $S_1$ of the circuit of FIG. 7 is replaced with the two-junction type superconducting quantum interferometer $S_5$. As other features of the construction and operation are obvious from the description of the previous embodiments, further description of the circuit of FIG. 9 will be omitted.

Figure 10:
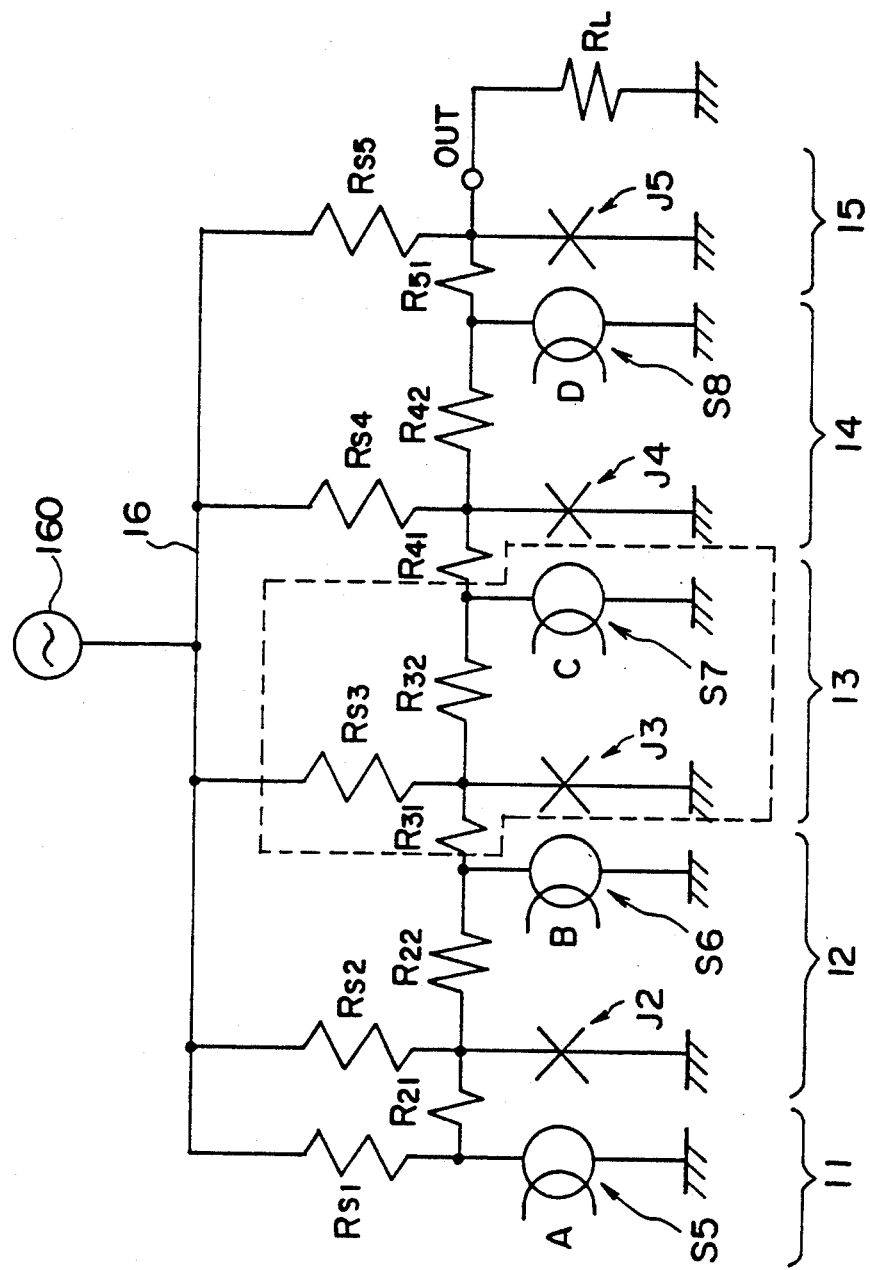
FIG. 10 is a circuit diagram showing the construction of a four-input Josephson AND gate according to a fifth embodiment of the present invention.

FIG. 10 shows a four-input AND gate according to a fifth embodiment of the present invention. In this embodiment, the superconducting quantum interferometers $S_1$–$S_4$ of FIG. 6 are replaced with two-junction type superconducting quantum interferometers $S_5$–$S_8$, respectively. With the use of the two-junction type superconducting quantum interferomters, it is possible to simplify the circuit construction and increase the integration density. As other features of the construction and operation are obvious from the description of the previous embodiments, further description of the circuit of FIG. 10 will be omitted.

Figure 11:
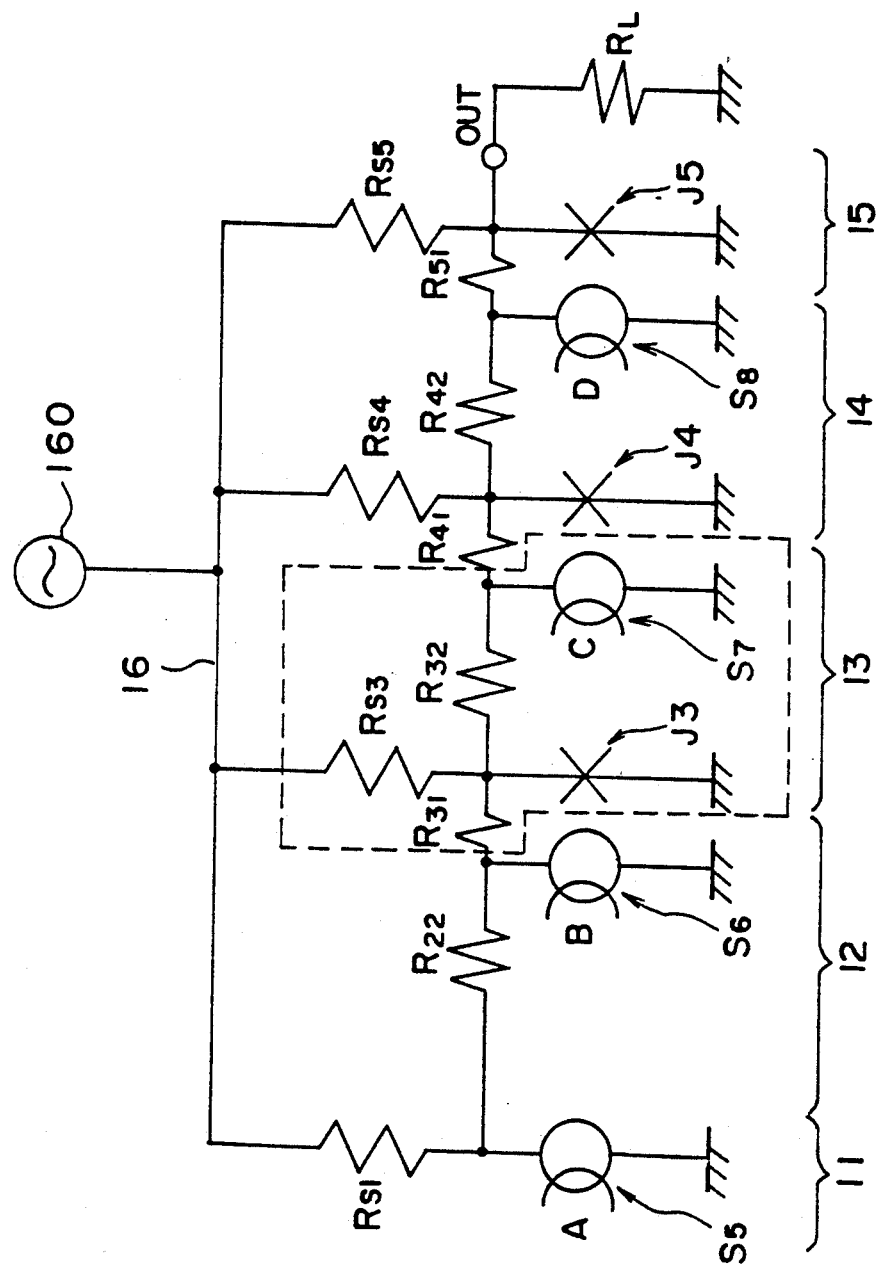
FIG. 11 is a circuit diagram showing the construction of a four-input Josephson AND gate according to a sixth embodiment of the present invention.

FIG. 11 shows a four-input AND gate according to a sixth embodiment of the present invention. In the present embodiment, the circuit has a construction substantially identical with the circuit of FIG. 7 except that the superconducting quantum interferometers $S_1$–$S_4$ are replaced with the two-junction type superconducting quantum interferometers $S_5$–$S_8$. As other features of the construction and operation of the present embodiment are obvious from the description of the previous embodiments, further description of the circuit of FIG. 11 will be omitted.

Figure 12:
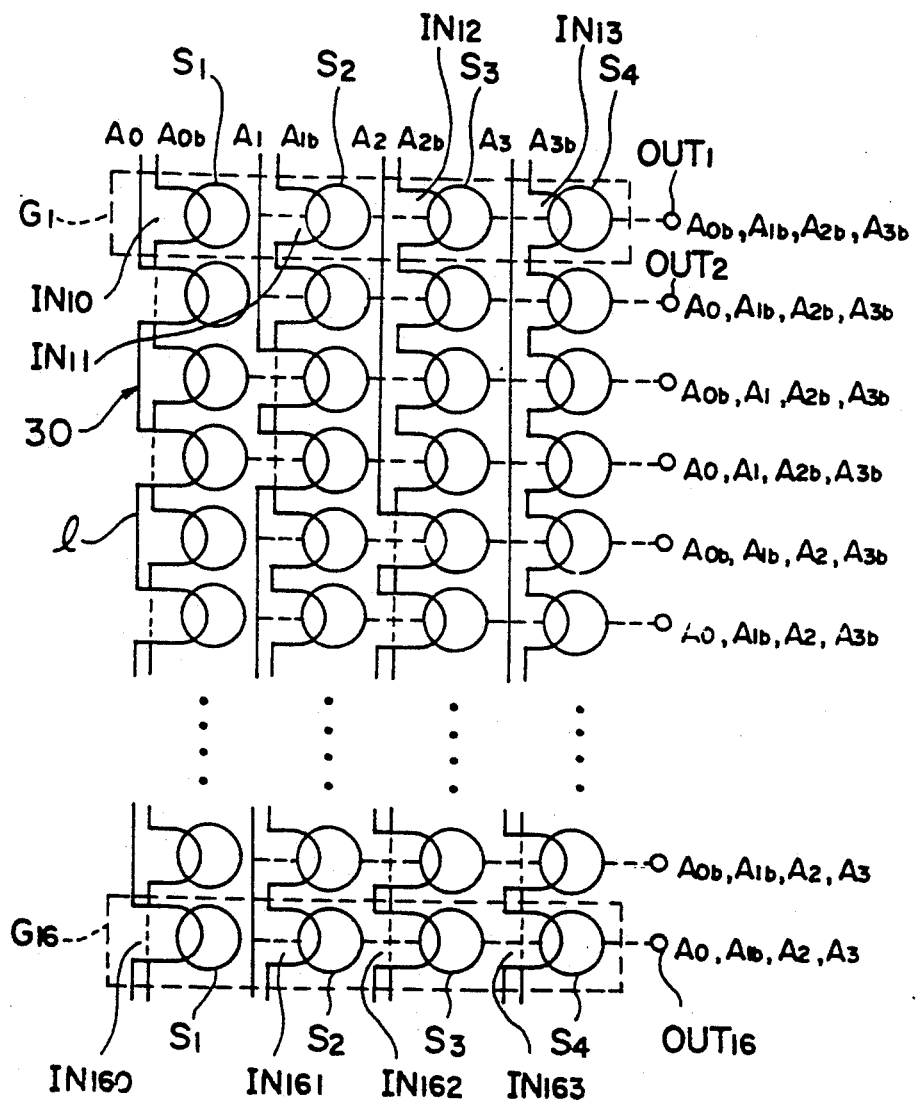
FIG. 12 is a circuit diagram showing the construction of a Josephson decoder circuit according to a seventh embodiment of the present invention.

FIG. 12 shows a Josephson decoder circuit according to a seventh embodiment of the present invention wherein the foregoing multiple-input Josephson AND gate is used.

Referring to FIG. 12, a plurality of four-input Josephson AND gates $G_1$–$G_{16}$ each having a construction shown in FIG. 6, are provided, of a number corresponding to the number of outputs of the Josephson decoder circuit. There, each Josephson AND gate $G_i$ (i=1-16) has multiple input ports $IN_{i0}$, $IN_{i2}$, $IN_{i3}$ and $IN_{i4}$ (i=1-16), wherein the Josephson AND gates $G_1$–$G_{16}$ are connected with each other by a superconducting interconnection wiring fixture 30 such that: either of complementary input signals $A_0$ and $A_{0b}$ is supplied to the input port $IN_{i0}$ (i=1-16), either of complementary input signals $A_1$ and $A_{1b}$ is supplied to the input port $IN_{i1}$, either of complementary input signals $A_2$ and $A_{2b}$ is supplied to the input port $IN_{i2}$, either of complementary input signals $A_3$ and $A_{3b}$ is supplied to the input port $IN_{i3}$, and either of complementary input signals $A_4$ and $A_{4b}$ is supplied to the input port $IN_{i4}$, wherein the suffix i covers all the Josephson AND gates $G_1$–$G_{16}$. It should be noted that the interconnection wiring fixture 30 includes a number of signal lines 1 provided in correspondence to each input signals $A_0$, ..., wherein each signal line 1 establishes a magnetic coupling with the corresponding superconducting quantum interferomters of the Josephson AND gates $G_i$ (i=1-16) consecutively.

As is usual in decoders, the combination of the true input signals $A_0$–$A_3$ and the complementary input signals $A_{0b}$–$A_{3b}$ is changed in each Josephson AND gate $G_i$. Thereby, each Josephson AND gate $G_i$ produces an output at an output terminal $OUT_i$ in corresponding to a combination of input signals that is different in each Josephson AND gate as indicated in FIG. 12.

In the Josephson decoder circuit of FIG. 12, it should be noted that the circuit construction can be simplified significantly over the conventional decoder circuit wherein the multiple-input AND gate is constructed by using a number of Josephson AND gates and Josephson OR gates.

Figure 13:
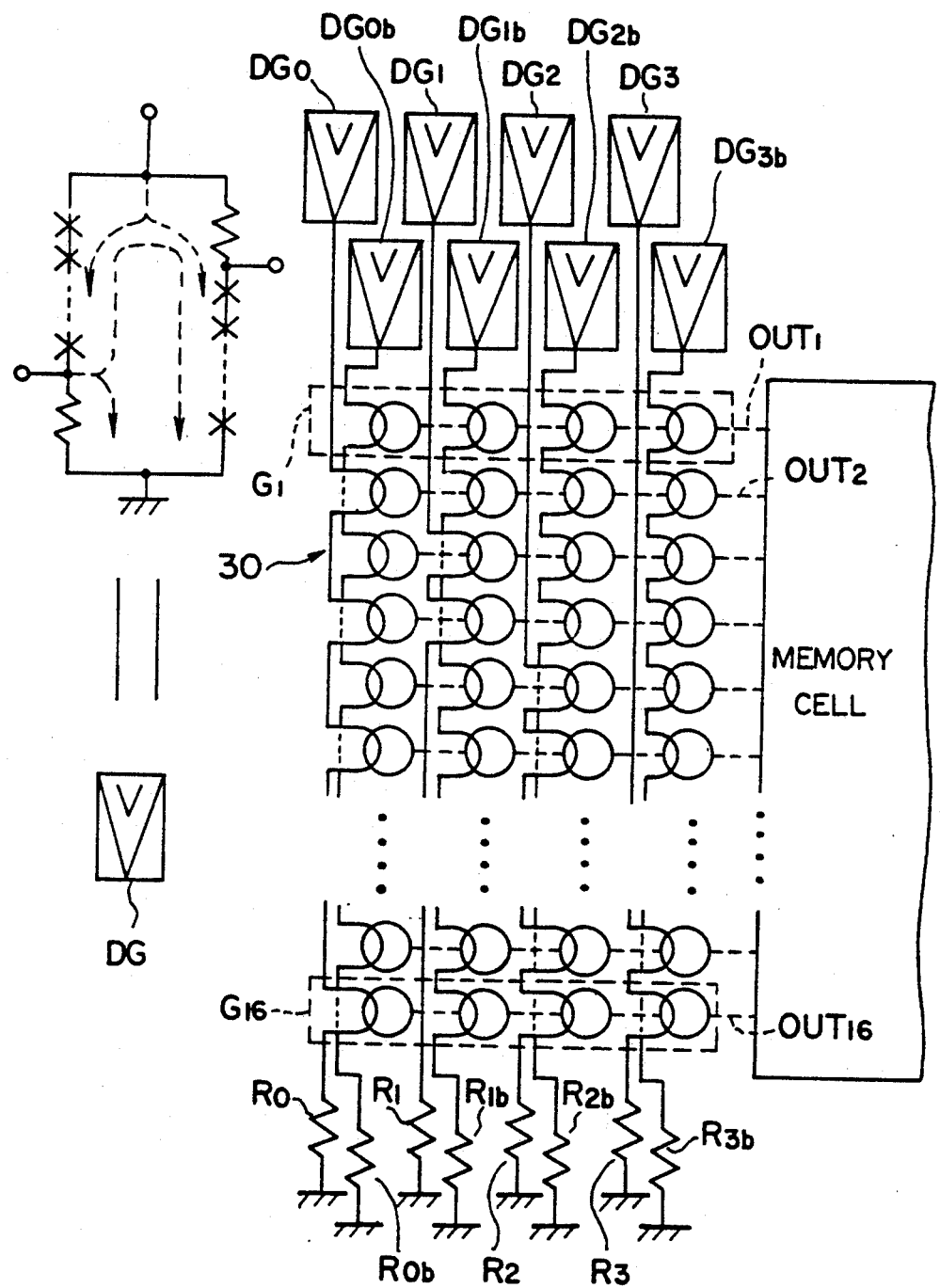
FIG. 13 is a circuit diagram showing the construction of a Josephson decoder circuit according to an eighth embodiment of the present invention.

FIG. 13 shows a Josephson decoder circuit according to an eighth embodiment of the present invention, wherein the Josephson decoder circuit has a construction similar to the circuit of FIG. 12 except that there are provided voltage boosters $DG_0$–$DG_3$ and $DG_{0b}$–$DG_{3b}$ in correspondence to each signal line 1 of the interconnection wiring fixture 30 for boosting the voltage level of the input signals $A_0$–$A_3$ and $A_{0b}$–$A_{3b}$. The voltage boosters may have a construction proposed previously by the inventor of the present invention and disclosed in the Laid-open European Patent Application EP 0 441 299, which is incorporated herein as reference.

By using the voltage booster, one can obtain a sharply rising leading edge of the input logic signals and the operational speed of the decoder is improved. Further, by providing a terminal resistor such as a resistor $R_0$ in correspondence to each signal line 1 of the interconnection wiring fixture 30, and by setting the value of the terminal resistors appropriately, one can obtain an ideal transfer characteristic of the input signals. It should be noted that FIG. 13 shows the case wherein the Josephson decoder circuit is used as a memory decoder that addresses a memory cell.

Figure 14:
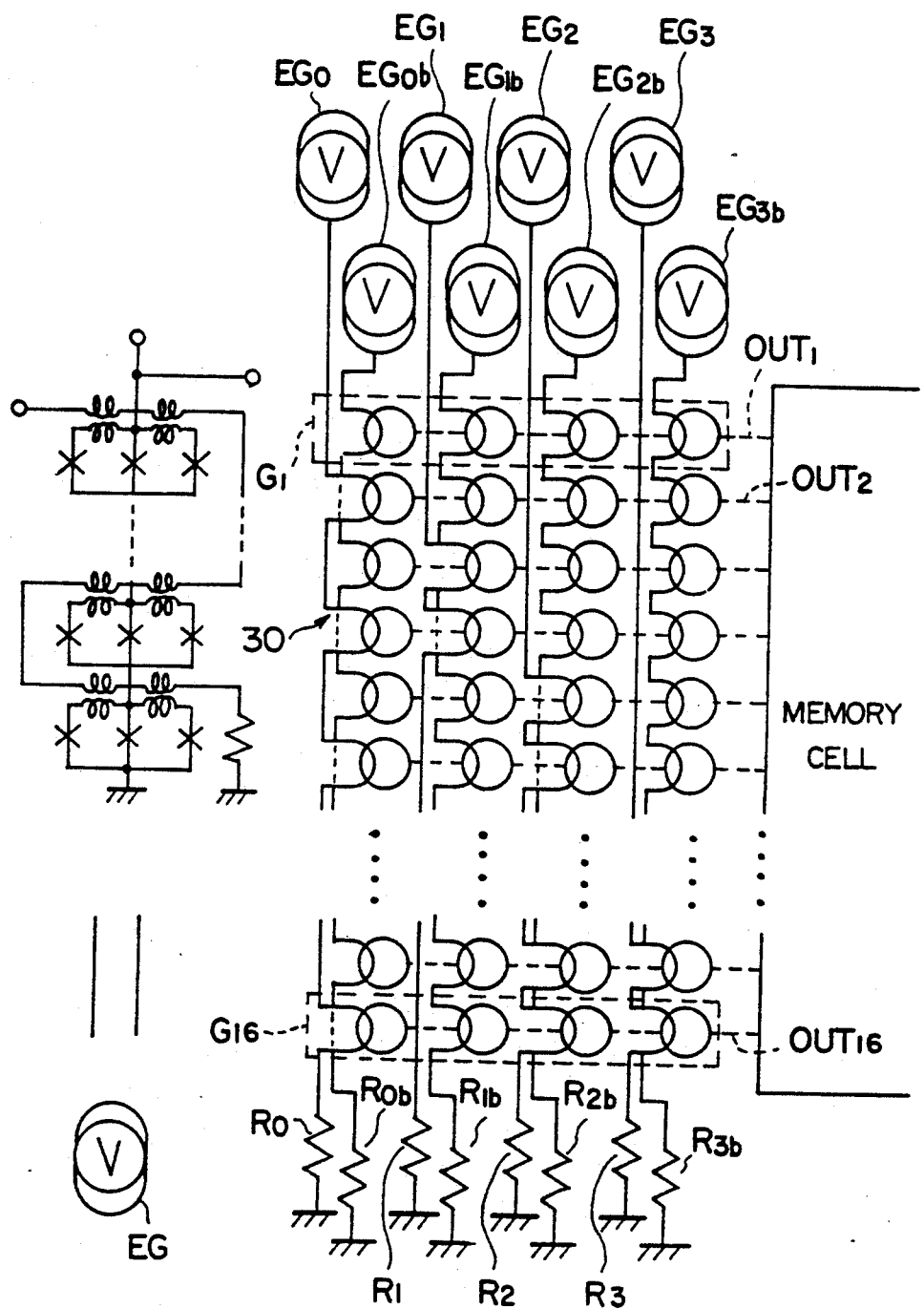
FIG. 14 is a circuit diagram showing the construction of a Josephson decoder circuit according to a ninth embodiment of the present invention.

FIG. 14 shows a Josephson decoder circuit according to ninth embodiment of the present invention, wherein the decoder circuit of the present invention has a construction substantially identical to the construction of the decoder of FIG. 13 except that voltage boosters $EG_0$–$EG_3$ and $EG_{0b}$–$EG_{3b}$ are provided in place of the voltage boosters $DG_0$–$EG_3$ and $DG_{0b}$–$DG_{3b}$. The construction of each voltage booster EG is represented also in FIG. 14. More detailed description of the voltage booster EG can be found in the aforementioned Laid-open European Patent Application EP 0 411 299. Thereby, one can improve the operational speed of the decoding operation similarly to the previous embodiment.

Next, a Josephson memory decoder according to a tenth embodiment of the present invention will be described with reference to FIG. 15(A).

Figure 15A:
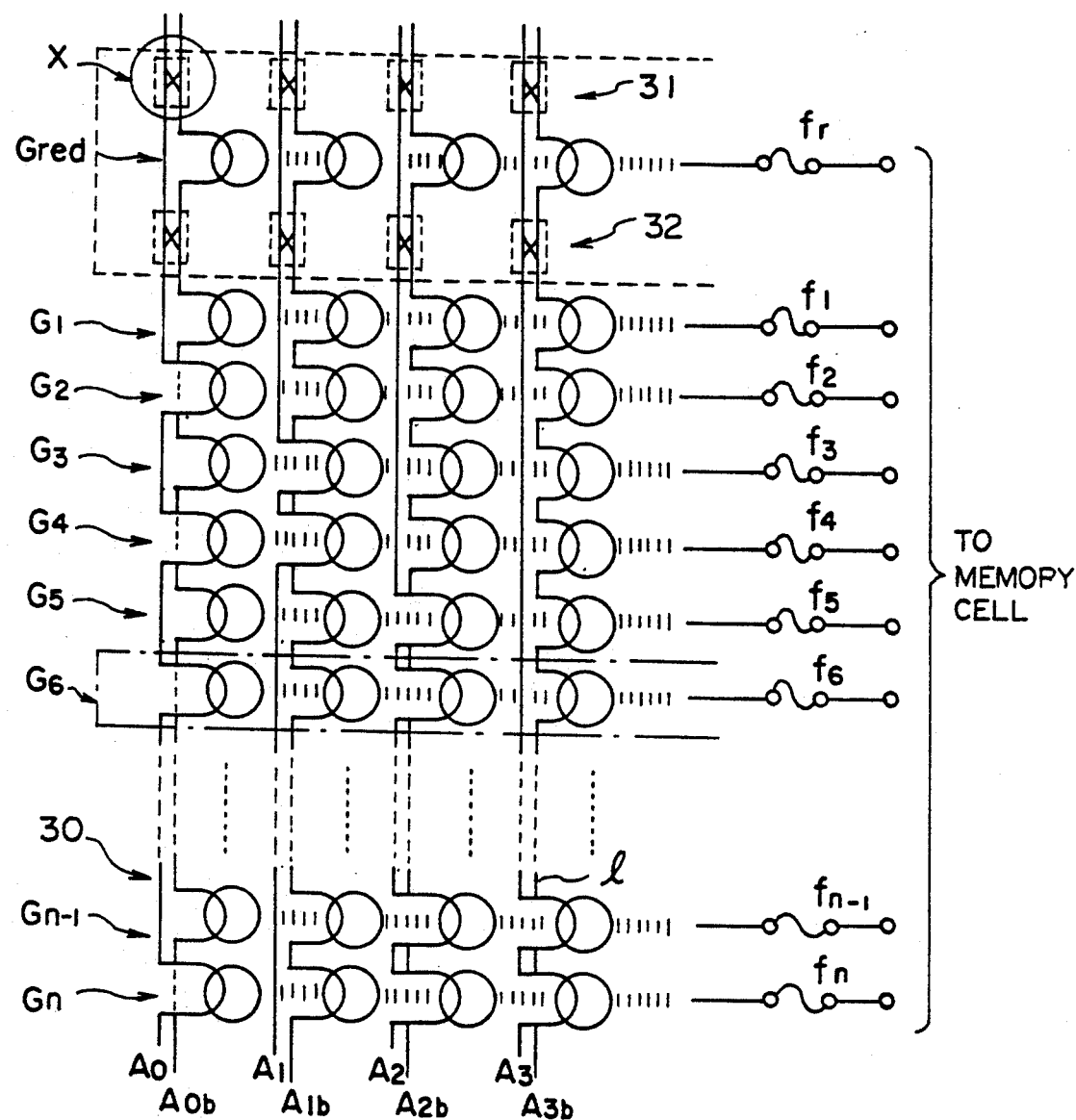
FIG. 15(A) is a circuit diagram showing a Josephson memory decoder according to a tenth embodiment of the present invention.

Referring to FIG. 15(A), the Josephson memory decoder of the present embodiment has a construction similar to the Josephson decoder of FIG. 12 except that each output of the Josephson AND gate $G_i$ is provided with a fuse $f_i$ that is selectively blown up by (i.e., burned-out) irradiation of a laser beam.

In addition, the Josephson memory decoder of FIG. 15(A) includes a redundant gate $G_{red}$ having a similar construction as other Josephson AND gates, for addressing a redundant memory cell. There, the redundant gate $G_{red}$ is connected to the interconnection wiring fixture 30 via programmable wiring elements 31, 32, of which the construction thereof is shown in detail in FIG. 15(B).

Figure 15B:
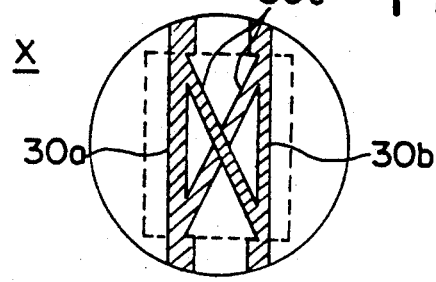
FIG. 15(B) is an enlarged view showing a programmable part of the circuit of FIG. 15(A) in detail.

Referring to FIG. 15(B), the programmable wiring element 31, shown as includes conductor strips 30a and 30b that extend as a part of the signal line 1 of the interconnection wiring fixture 30. In addition, there are provided crossing conductor strips 30c that cross with each other between the conductor strips 30a and 30b. When there is no defective memory cell in the memory cell array, the crossing conductor strips 30c are disconnected by irradiation of the laser beam. Further, the fuse $f_r$ at the output of the redundant gate $G_{red}$ is disconnected simultaneously. Thereby, the addressing of the memory cell by the redundant gate $G_{red}$ is prohibited and the Josephson memory decoder of FIG. 15(A) operates similarly to the Josephson decoder of FIG. 12.

Figure 16A:
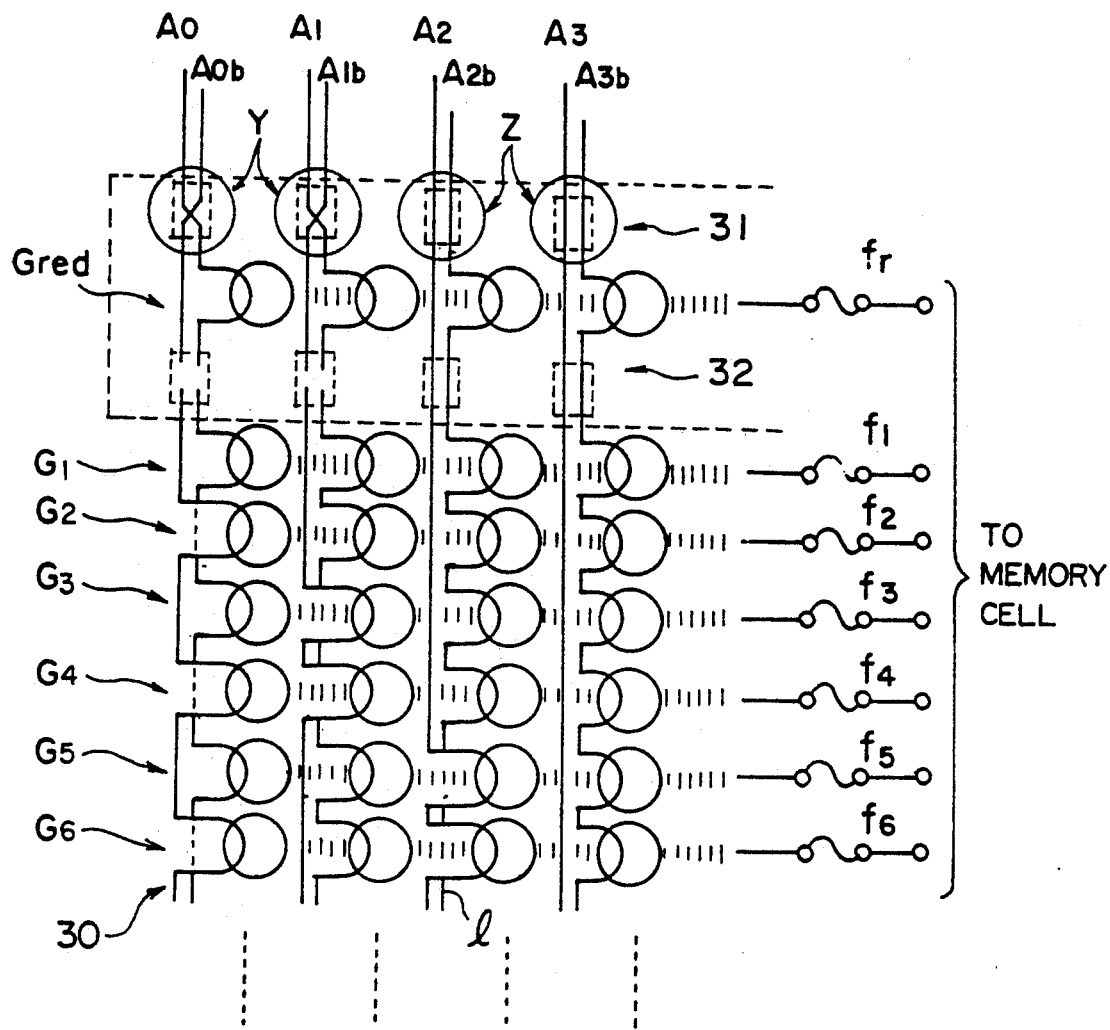
FIG. 16(A) is a circuit diagram showing an addressing of a redundant memory cell in the Josephson memory decoder of FIG. 15(A)
Figure 16B:
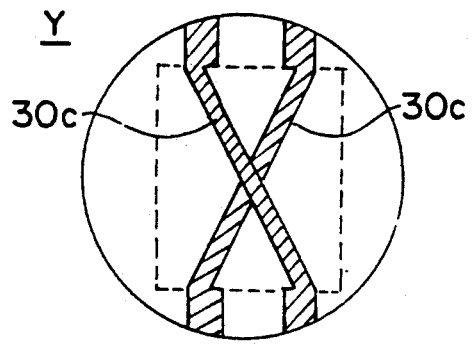
FIGS. 16(B) and 16(C) are diagrams similar to FIG. 15(B) showing the programmable part of the circuit of FIG. 16(A) in an enlarged scale for two different settings.
Figure 16C:
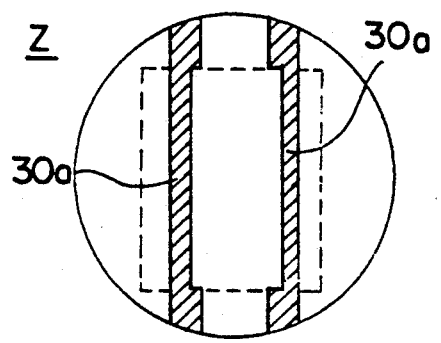

When there is a defective memory cell included in the memory cell array, the fuse for the Josephson AND gate that addresses the defective memory cell such as the gate $G_4$ is disconnected by the laser beam irradiation, and the programmable wiring elements 31 and 32 are modified as shown in FIGS. 16(B) and 16(C) also by the laser beam irradiation. There, the element 31 designated by Y, is modified as shown in FIG. 16(B) by blowing up the conductor strips 30a and 30b. Thereby, the true input signal $A_0$ and the complementary input signal $A_{0b}$ are exchanged. In the gate $G_4$, a similar exchange of the true input signal and the complementary input signal is achieved also for the signals $A_1$ and $A_{1b}$. In the element 31, designated by Z in FIG. 16(C) on the other hand, the crossing conductor strips 30c are blown up by the irradiation of the laser beam. Thereby, the true input signal and the complementary input signal are passed through the programmable wiring element 31 as they are, without being exchanged.

As a result of the exchange of the true and complementary input signals caused by the programmable wiring element 31, the redundant Josephson AND gate $G_{red}$ is activated by the combination of the logic state of the input signals that is identical with the combination that activates the Josephson AND gate $G_4$. Thereby, the redundant memory cell is addressed by the redundant Josephson AND gate $G_{red}$. On the other hand, the selection of the defective memory cell is prohibit by disconnecting the fuse $f_4$ simultaneously.

At the downstream side of the redundant Josephson AND gate $G_{red}$, there is provided another programmable wiring element 32 that is programmed such that the exchange of the true input signal and the complementary input signal caused by the programmable wiring element 31 is canceled upon passage of the input signals therethrough. Thus, when the input signals $A_0$ and $A_{0b}$ are exchanged in the programmable wiring element 31, the programmable wiring element 32 for the input signals $A_0$ and $A_{0b}$ is programmed identically with the element 31 as shown in FIG. 16(B) such that the input signals $A_0$ and $A_{0b}$ are exchanged again. A similar programming is made also for the programmable wiring element 32 for the input signals $A_1$ and $A_{1b}$. On the other hand, the programmable wiring element 32 for the input signals $A_2$ and $A_{2b}$, $A_3$ and $A_{3b}$ is programmed as shown in FIG. 16(C) in correspondence to the programming of the corresponding element 31. By providing the programmable wiring elements 31 and 32 as a pair in each signal line 1 of the interconnection wiring fixture 30, one can achieve the supply of the input signals to each of the normal Josephson AND gates $G_1$-$G_n$ as if there were no redundant Josephson AND gate $G_{red}$.

Figure 17:
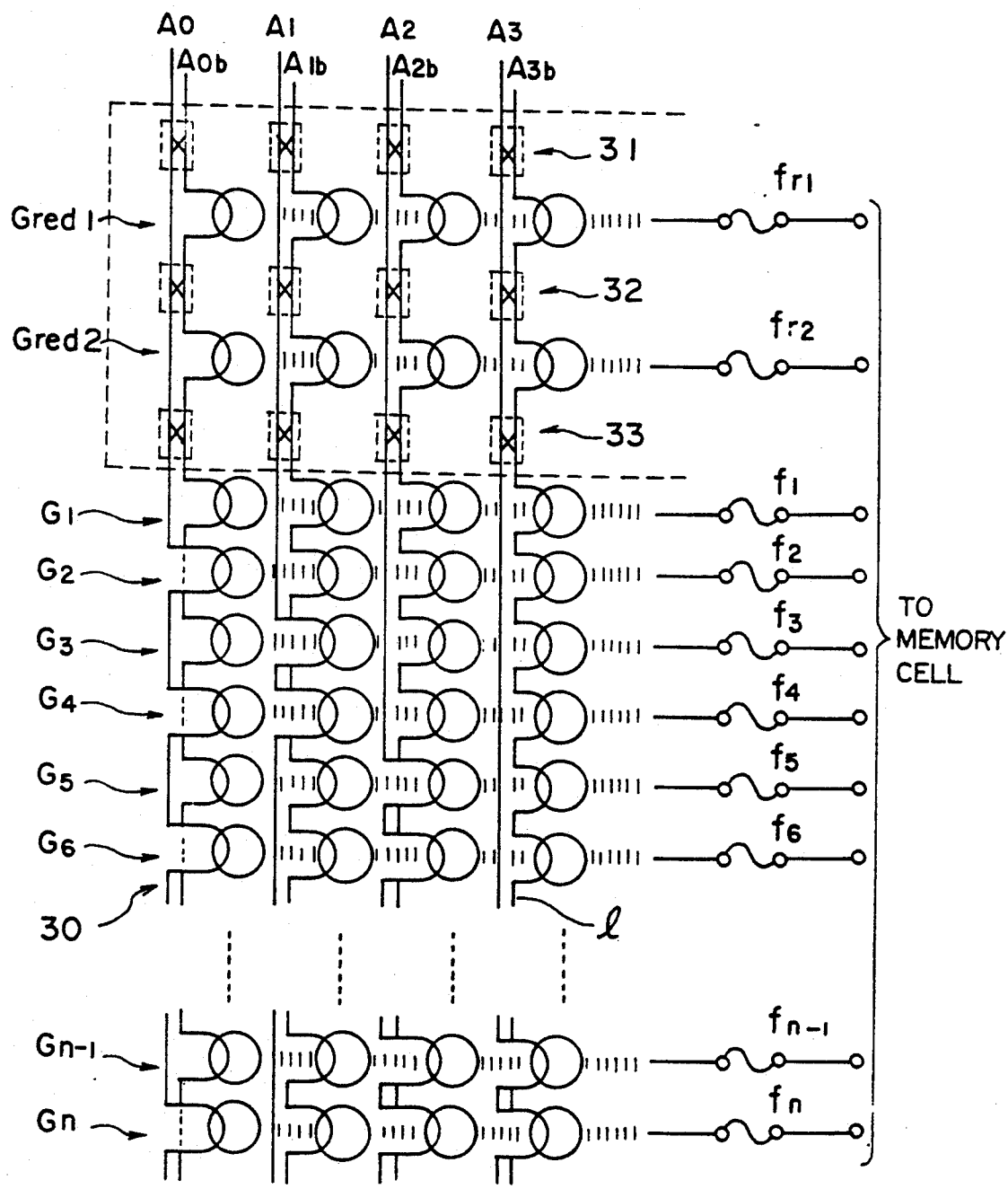
FIG. 17 is a circuit diagram showing a Josephson memory decoder according to an eleventh embodiment of the present invention.

FIG. 17 shows the case wherein two redundant Josephson AND gates $G_{red1}$ and $G_{red2}$ are provided. In this case, the programmable wiring elements 31, 32 and 33 are provided as indicated in the drawing. As the construction and operation of the present embodiment is obvious from the description of the previous embodiment, further description of the present embodiment will be omitted. It will be understood that one can increase the number of redundant Josephson AND gates by providing the programmable wiring elements at the upstream side and the downstream side of each redundant Josephson AND gate along the signal lines 1 of the interconnection wiring fixture 30.

Figure 18:
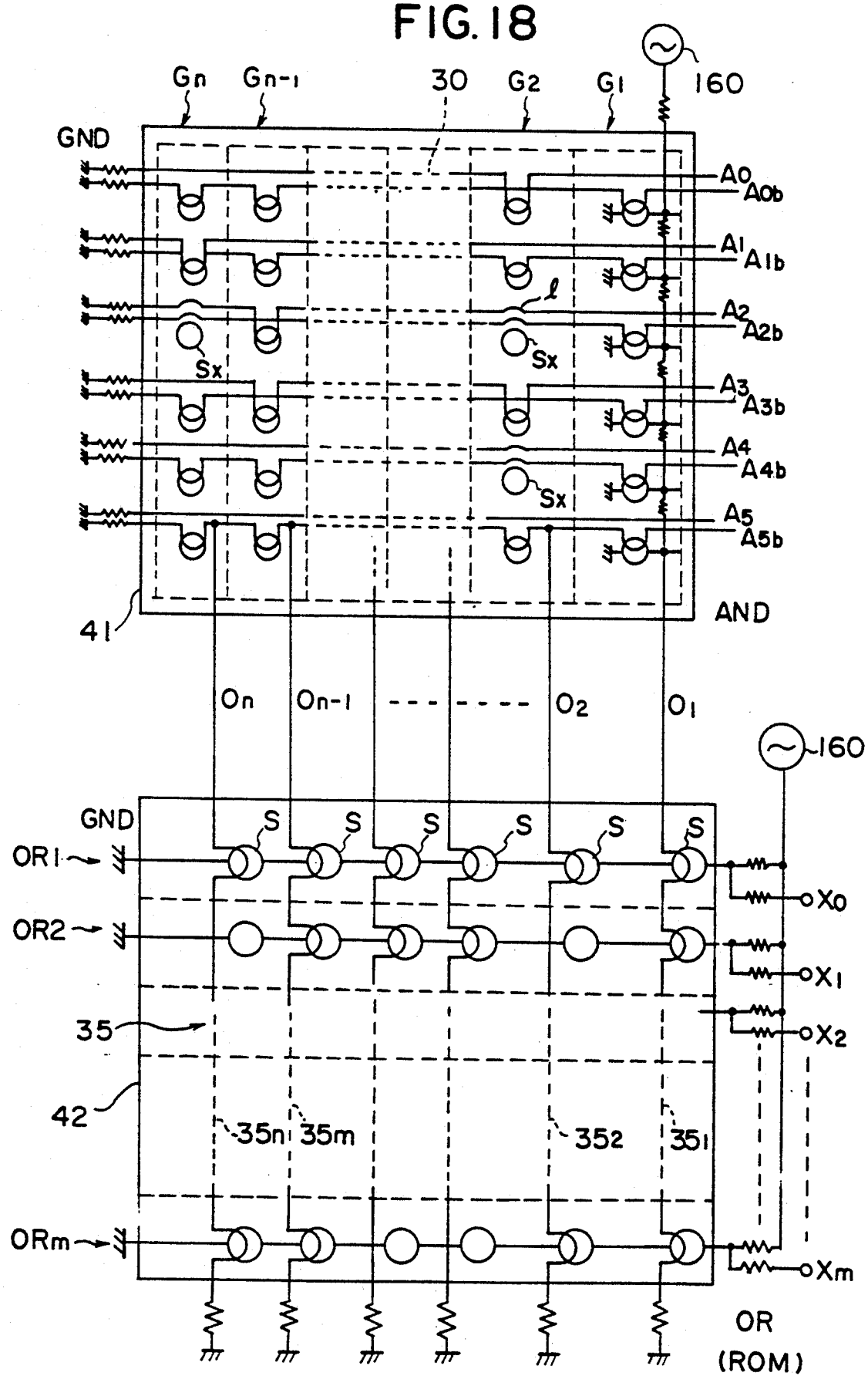
FIG. 18 is a circuit diagram showing a Josephson programmable logic array according to a twelfth embodiment of the present invention.

FIG. 18 shows a twelfth embodiment of the present invention.

Referring to FIG. 18, the circuit of the present invention forms a programmable logic array and includes an AND array 41 and an OR array 42, wherein the AND array 41 has a construction similar to the decoder of FIG. 12 in that there are provided a plurality of Josephson AND gates $G_1$-$G_n$ connected with each other by the interconnection wiring fixture 30.

On the other hand, the AND array 41 is different from the decoder of FIG. 12 in that some of the superconducting quantum interferometers in the Josephson AND gate represented as $S_x$ are de-coupled from the signal line 1 of the interconnection wiring fixture 30. Such a decoupling can be achieved by providing a conductor path such that the signal line 1 circumvents some of the superconducting quantum interferometers. Thereby, the AND array 41 produces output signals $O_{1-n}$ with a number corresponding to the number of the Josephson AND gates arranged in the AND array 41. In the AND array 41 thus formed, the logic product operation is achieved based upon the input signals $A_0$. . . except for those input signals that are supplied without magnetic coupling with the superconducting quantum interferomters.

The OR array 42 includes a number of OR gates $OR_1$-$OR_m$, wherein each OR gate includes a number of superconducting quantum interferometers S connected in series for receiving the a.c. bias current from the a.c. current source 160. It should be noted that the a.c. current source 160 also drives the superconducting quantum interferometers of the Josephson AND gate $G_1$-$G_n$. As the superconducting quantum interferometers S are connected in series between the a.c. current source 160 and the superconducting ground plane GND, the switching of any one of the superconducting quantum interferometer S causes a transition of the output voltage obtained at an output terminal $X_0$-$X_m$. In other words, the gate $OR_1$-$OR_m$ achieves the logic OR operation.

When the output signals $O_1$-$O_n$ of the AND array 41 are supplied to the OR array 42, the signals $OR_1$-$OR_m$ are transferred from one OR gate to the next OR gate along the signal lines $35_1$-$35_n$ of an interconnection wiring fixture 35 that is similar to the interconnection wiring fixture 30. Thereby, the signals $O_1$-$O_n$ cause the switching of the OR array 42. There, some of the signal lines $35_1$-$35_n$ are provided to bypass the superconducting quantum interferometer of the OR gates such that the signal that is supplied on the signal line does not cause the switching of the OR gate. By combining the logic AND operation thus achieved in the AND array 41 and the logic OR operation achieved in the OR array 42, one can achieve any desired logic operation. It should be noted that the selective bypassing of the signal lines $35_1$-$35_n$ can be achieved by providing a bypassing conductor pattern in addition to the signal lines that establish the magnetic coupling.

Figure 19:
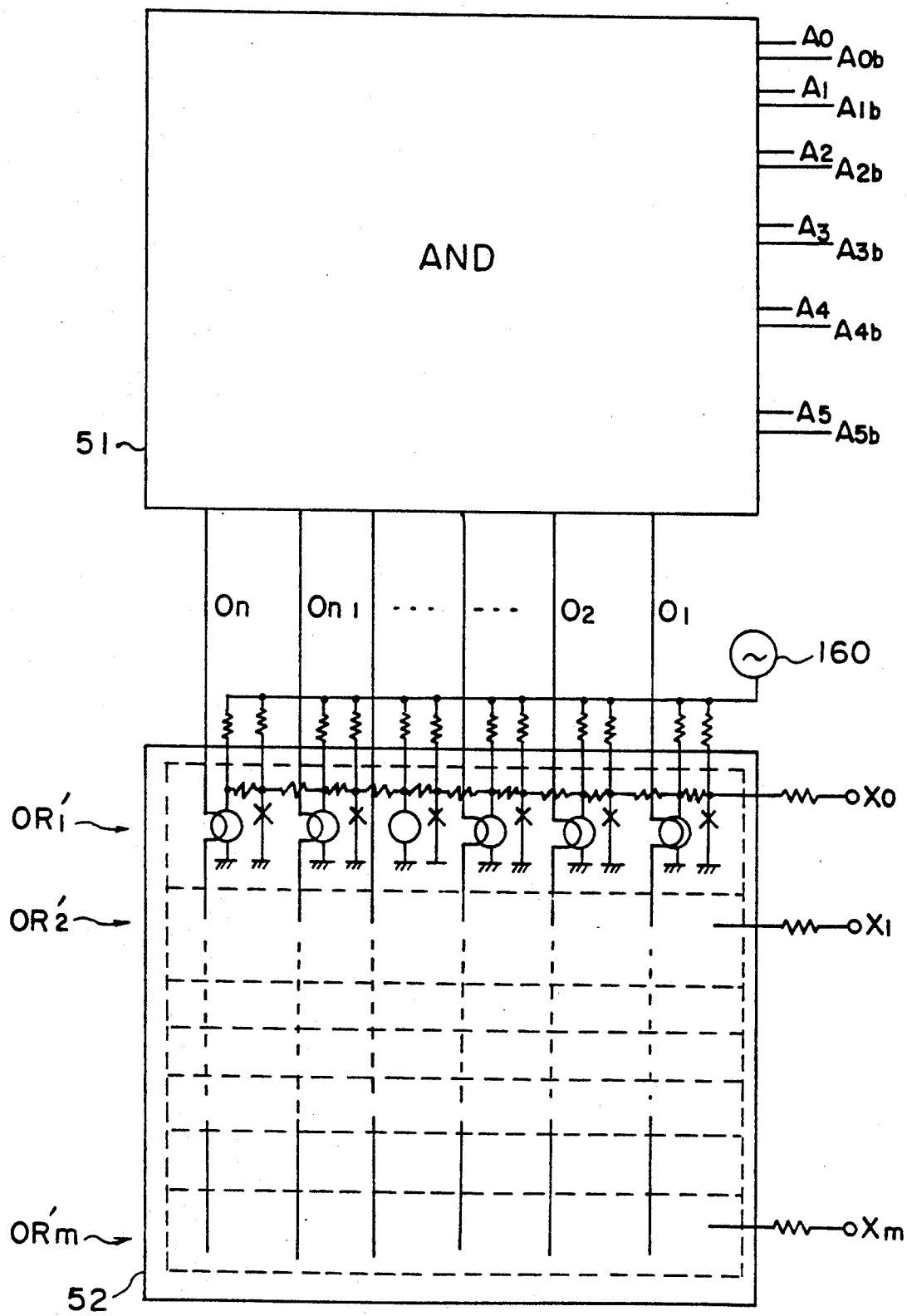
FIG. 19 is a circuit diagram showing a Josephson programmable logic array according to a thirteenth embodiment of the present invention.

FIG. 19 shows a programmable logic array according to a thirteenth embodiment of the present invention. The programmable logic array includes an AND array 51 substantially identical in construction with the AND array 41 of the previous embodiment and an OR array 52 to be described below. Thus, the AND array 51 produces the output signals $O_1-O_n$ in response to the input signals $A_0$, $A_{0b}$, ... and supplies the same to the OR array 52.

Figure 20:
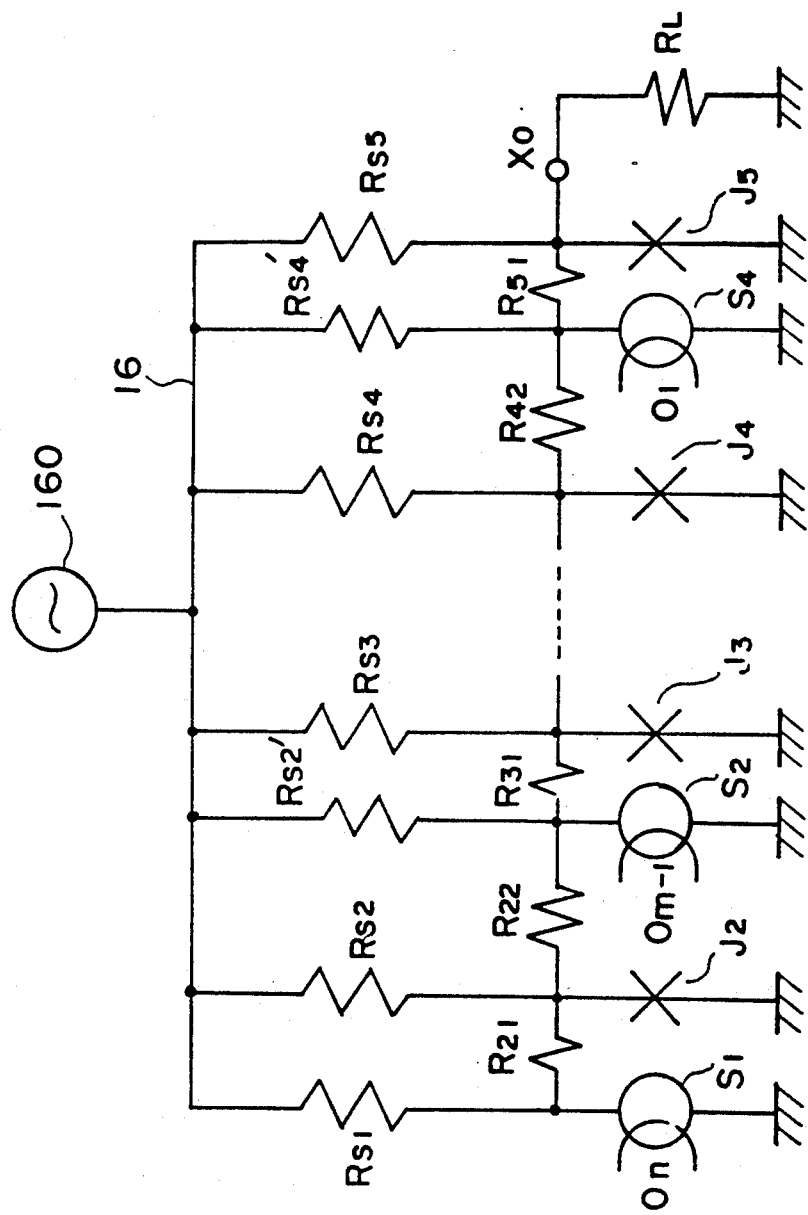
FIG. 20 is a circuit diagram showing a Josephson OR gate that is used in the circuit of FIG. 19.

The OR array 52 includes a number of Josephson OR gates each having a construction shown in FIG. 20 and achieves the logic OR operation similarly to the OR array 42. Thereby, the result of the desired logic operation is obtained at output terminals $X_0-X_m$.

FIG. 20 shows the construction of the Josephson OR gate used in the OR array 52.

Referring to FIG. 20, the Josephson OR gate has a construction similar to the Josephson AND gate described with reference to FIG. 6, except that there is provided an additional resistance $Rs_i'$ in correspondence to each superconducting quantum interferometer $S_i$ of the i-th stage for supplying thereto an a.c. bias current from the bias bus 16. There, each superconducting quantum interferometer $S_i$ is biased by the resistor $Rs_i'$ to a level slightly below a level above which the transition to the finite voltage state occurs. When biased as such, the input signal to the superconducting quantum interferometer of any stage causes the switching of the superconducting quantum interferometer to the finite voltage stage, and such a transition to the finite voltage state triggers the progressive transition of the superconducting quantum interferomters of the subsequent stages as described already with reference to the Josephson AND gate. Thereby, the circuit of FIG. 20 acts as the logic OR gate.

Further, the present invention is not limited to the embodiments described heretofore, but various variations and modifications may be made without departing from the scope of the invention.

What is claimed is:

1. A multiple-input Josephson AND gate having a plurality of input ports to which corresponding input currents are supplied, comprising:
a plurality of Josephson logic gate elements, of a number corresponding to the number of said input ports and cascaded with each other from a first stage to a final stage, each of said respective Josephson logic gate elements of said first through final stages comprising:
a superconducting quantum interferometer which produces an output signal in accordance with a transition thereof from a superconducting state to a finite voltage state;
an input line connected to a corresponding input port and receiving therefrom the corresponding input current, said input line being coupled magnetically to the superconducting quantum interferometer and transferring the input current to said superconducting quantum interferometer; and
biasing means for supplying a bias current to said superconducting quantum interferometer, said biasing means supplying the bias current at a level such that said superconducting quantum interferometer undergoes said transitions to the finite voltage stage in response to the input current supplied to the input line, each of said biasing means of said second through final stages being supplied with the output signal of the superconducting quantum interferometer of the respective, next previous stage as a trigger signal and producing said bias current in response to said trigger signal.

2. A multiple-input Josephson AND gate as claimed in claim 1 in which said biasing means of each of said second through final stages comprises a first bias resistor having a first end connected to a bias current source and having a second end, a Josephson junction having a first end connected to said second end of said first bias resistor and a second end connected to a superconducting ground plane, an input resistor having a first end connected to the superconducting quantum interferometer of the previous stage for receiving the output signal therefrom as said trigger signal and a second end connected to the first end of the Josephson junction, and a second bias resistor having a first end connected to the first end of the Josephson junction and a second end connected to a bias terminal of the superconducting quantum interferometer of the corresponding stage.

3. A multiple-input Josephson AND gate as claimed in claim 2 in which said second bias resistor has a resistance of a value selected to be substantially equal to the gap voltage of the Josephson junction divided by the critical current of the Josephson junction.

4. A multiple-input Josephson AND gate as claimed in claim 2, further comprising an output circuit, said output circuit comprising a bias resistor having a first end connected to the bias current source and a second end, a Josephson junction having a first end connected to said second end of said bias resistor and a second end connected to a superconducting ground plane, and an input resistance having a first end connected to the superconducting quantum interferometer of the respective, previous stage for receiving the output signal therefrom and a second end connected to said first end of the Josephson junction of the output circuit.

5. A multiple-input Josephson AND gate as claimed in claim 1, wherein:
each of said biasing means of said third through final stages comprises a first bias resistor having a first end connected to a bias current source and having a second end, a Josephson junction having a first end connected to said second end of said first bias resistor and a second end connected to a superconducting ground plane, an input resistor having a first end connected to the superconducting quantum interferometer of the respective, next previous stage for receiving the output signal therefrom as said trigger signal and a second end connected to the first end of the Josephson junction, and a second bias resistor having a first end connected to the first end of the Josephson junction and a second end connected to a bias terminal of the super conducting quantum interferometer of the corresponding stage; and
said biasing means of said second stage comprises a bias resistor having a first end connected to the superconducting quantum interferometer of said initial stage for receiving the output signal therefrom and a second end connected to a bias terminal of the superconducting quantum interferometer of said second stage.

6. A Josephson decoder circuit for decoding input data represented by a plurality of bits, comprising:
a plurality of multiple-input Josephson AND gates each having a plurality of input ports to which corresponding input currents are supplied and including a plurality of Josephson logic gate elements of a number corresponding to the number of the input data bits, said plurality of Josephson logic gate elements being cascaded, in each Josephson AND gate, with each other from a first stage to a final stage;

each of said Josephson logic gate elements comprising:

a superconducting quantum interferometer which produces an output signal in accordance with a transition thereof from a superconducting state to a finite voltage state;

an input line connected to a corresponding input port and receiving therefrom the corresponding input current, said input line being coupled magnetically to the superconducting quantum interferometer and transferring the input current to said superconducting quantum interferometer; and biasing means for supplying a bias current to said superconducting quantum interferometer, said biasing means supplying the bias current at a level such that said superconducting quantum interferometer undergoes said transition to the finite voltage stage in response to the input current supplied to the input line, each of said biasing means of said second through final stages being supplied with the output signal of the superconducting quantum interferometer of the respective, next previous stage as a trigger signal and producing said bias current in response to said trigger signal; and interconnection means for connecting the respective input lines of the plurality of cascaded Josephson logic gate elements, of each of the corresponding stages of each Josephson AND gate, with each other in accordance with respective, different logic combinations for each of the plurality of Josephson AND gates and such that the input data is supplied to the plurality of Josephson AND gates according to the respective, different logic combinations.

7. A Josephson decoder circuit as claimed in claim 6 in which said plurality of Josephson AND gates is of a number corresponding to the number of different logic combinations of the input data.

8. A Josephson decoder circuit as claimed in claim 6 in which said plurality of Josephson AND gate is of a number exceeding the number of different logic combinations of the input data, said interconnection means comprising programmable interconnection means for connecting said Josephson AND gates to said interconnection means such that more than one Josephson AND gate produces a corresponding output signal in response to the identical input data.

9. A programmable logic array circuit supplied with and responsive to input data represented by a plurality of bits, for producing output data after a predetermined logic operation, comprising:

a programmable Josephson AND array comprising a plurality of multiple-input Josephson AND gates each having a plurality of input ports to which corresponding input currents are supplied and including a plurality of Josephson logic gate elements of a number corresponding to the number of bits of the input data, said plurality of Josephson logic gate elements of each Josephson AND gate being cascaded with each other from a first stage to a final stage;

each of said Josephson logic gate element comprising:

a superconducting quantum interferometer which produces an output signal in accordance with a transition thereof from a superconducting state to a finite voltage state;

an input line connected to a corresponding input port and receiving therefrom the corresponding input current, said input line being coupled magnetically to the superconducting quantum interferometer and transferring the input current to said superconducting quantum interferometer; and biasing means for supplying a bias current to said superconducting quantum interfereomter, said biasing means supplying the bias current at a level such that said superconducting quantum interferometer undergoes said transition to the finite voltage stage in response to the input current supplied to the input line, each of said biasing means of said second through final stages being supplied with the output signal of the superconducting quantum interferometer of the respective, next previous stage as a trigger signal and producing said bias current in response to said trigger signal; and interconnection means for connecting the respective input lines of the plurality of cascaded Josephson logic gate elements, of each of the corresponding stages of each Josephson AND gate, with each other in accordance with respective, different logic combinations for each of the plurality of Josephson AND gates and such that the input data is supplied to the plurality of Josephson AND gates according to the respective, different logic combinations;

a programmable Josephson OR array supplied with the output data of the programmable Josephson AND array, said programmable Josephson OR array comprising a plurality of Josephson logic gate elements each comprising a superconducting quantum interferometer and an input line carrying thereon an input current, said input line being coupled magnetically to the superconducting quantum interferometer for transferring the input current to said superconducting quantum interferometer, said Josephson logic OR array performing a logic sum operation on the output data of said programmable Josephson AND array and producing corresponding output data, said programmable Josephson OR array including a selected Josephson logic gate element that is disabled.

10. A programmable logic array circuit as claimed in claim 9, wherein said plurality of Josephson logic gate elements comprise respective multiple-input Josephson OR gates cascaded with each other and of a number corresponding to the number of output signals of said programmable Josephson AND array and, in each of said multiple-input Josephson logic OR gate elements:

the superconducting quantum interferometer produces an output signal in response to a transition from a superconducting state to a finite voltage state, and the input line is connected to said programmable Josephson AND array for receiving a corresponding output current of said programmable Josephson AND array, said input line being coupled magnetically to the superconducting quantum interferometer for transferring the output current to said superconducting quantum interferometer; and each of said multiple-input Josephson logic OR gate further comprising:

first biasing means for supplying a first bias current to said superconducting quantum interferometer at a level such that said superconducting quantum interferometer undergoes said transition to the finite voltage state in response to the input current supplied to the input line thereof, and second biasing means for supplying a second bias current to said superconducting quantum interferometer, said second biasing means supplying the second bias current at a level such that said superconducting quantum interferometer undergoes said transition to the finite voltage stage irrespective of the input current supplied to the input line thereof, provided that said superconducting quantum interferometer is supplied with said first bias current; and each of said second first biasing means of said second through final stages being supplied with the output signal of the superconducting quantum interferometer of the respective, next previous stage as a trigger signal and producing said second bias current in response to said trigger signal.

11. A multiple-input Josephson OR gate having a plurality of input ports to which corresponding input currents are supplied, comprising:

a plurality of Josephson logic gate elements of a number corresponding to the number of said input ports and cascaded with each other from a first stage to a final stage, each of said Josephson logic gate elements comprising:

a superconducting quantum interferometer which produces an output signal in accordance with a transition thereof from a superconducting state to a finite voltage state, an input line connected to said input port and receiving therefrom the corresponding input current, said input line being coupled magnetically to the superconducting quantum interferometer for transferring the input current to said superconducting quantum interferometer, first biasing means for supplying a first bias current to said superconducting quantum interferometer at a level such that said superconducting quantum interferometer undergoes said transition to the finite voltage state in response to the input current supplied to the input line, and second biasing means for supplying a second bias current to said superconducting quantum interferometer, said second biasing means supplying the second bias current at a level such that said superconducting quantum interferometer undergoes said transition to the finite voltage stage irrespective of the input current supplied to the input line, provided that the superconducting quantum interferometer is supplied with said first bias current; and each of said second first biasing means of said second through said final stages being supplied with the output signal of the superconducting quantum interferometer of the respective, next previous stage as a trigger signal and producing said second bias current in response to said trigger signal.

* * * * *

UNITED STATES PATENT AND TRADEMARK OFFICE
CERTIFICATE OF CORRECTION

PATENT NO. : 5,233,244
DATED : Aug. 3, 1993
INVENTOR(S) : SUZUKI

It is certified that error appears in the above-indentified patent and that said Letters Patent is hereby corrected as shown below:

TITLE PAGE: [56] References Cited, under U.S. PATENT DOCUMENTS, change the fourth number from "4,097,265" to --4,097,765--.

Col. 6, line 68, after "connected" insert --with each other at the first end of the Josephson--.

Col. 10, line 68, after "as" insert --"X",--.

Col. 11, line 40, change "prohibitby" to --prohibited by--.

Col. 13, line 22, change "there&o" to --thereto--.

Col. 15, line 46, change "gate" to --gates--.

Signed and Sealed this

Twenty-first Day of June, 1994

Attest:

BRUCE LEHMAN

*Attesting Officer*        *Commissioner of Patents and Trademarks*